US007978787B2

(12) United States Patent
Shionoiri et al.

(10) Patent No.: US 7,978,787 B2
(45) Date of Patent: Jul. 12, 2011

(54) SEMICONDUCTOR DEVICE

(75) Inventors: Yutaka Shionoiri, Kanagawa (JP); Takanori Matsuzaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 765 days.

(21) Appl. No.: 11/914,601

(22) PCT Filed: May 25, 2006

(86) PCT No.: PCT/JP2006/310947
§ 371 (c)(1),
(2), (4) Date: Nov. 16, 2007

(87) PCT Pub. No.: WO2006/126728
PCT Pub. Date: Nov. 30, 2006

(65) Prior Publication Data
US 2009/0085638 A1    Apr. 2, 2009

(30) Foreign Application Priority Data

May 27, 2005  (JP) ................................. 2005-156469

(51) Int. Cl.
*H04L 27/00* (2006.01)
*H03K 9/00* (2006.01)
(52) U.S. Cl. ........ 375/316; 375/324; 375/345; 375/354; 340/10
(58) Field of Classification Search .................. 375/316, 375/324, 354, 345; 340/10.1
See application file for complete search history.

(56) References Cited

U.S. PATENT DOCUMENTS

| 4,959,872 | A | 9/1990 | Imai et al. |
|---|---|---|---|
| 5,742,183 | A | 4/1998 | Kuroda |
| 6,339,342 | B1 | 1/2002 | Yoshizawa |
| 6,659,352 | B1 | 12/2003 | Asada et al. |
| 6,784,719 | B2 | 8/2004 | Okamoto et al. |
| 6,848,620 | B2 | 2/2005 | Nakane et al. |
| 7,003,680 | B2 | 2/2006 | Masui et al. |
| 7,181,179 | B2 | 2/2007 | Fujisawa et al. |
| 7,663,473 | B2 * | 2/2010 | Koyama ...................... 340/10.1 |

(Continued)

FOREIGN PATENT DOCUMENTS

DE    3920685 A1    1/1990

(Continued)

OTHER PUBLICATIONS

European Search Report re application No. EP 06756866.7, dated Jul. 30, 2009.

(Continued)

*Primary Examiner* — Ted M Wang
(74) *Attorney, Agent, or Firm* — Husch Blackwell LLP

(57) ABSTRACT

It is an object of the present invention to prevent an error or malfunction such as nonresponse which is caused due to difference in pulse width in a semiconductor device capable of communicating data wirelessly. In a semiconductor device, a level shift circuit is provided between a data demodulation circuit and each circuit block where demodulated signals are outputted from the data demodulation circuit. In such a manner, voltage amplitude of the demodulated signal is made almost equal to that of the outputted signals from each circuit block. Accordingly, a pulse width of the demodulated signal is made almost equal to that of signals in each circuit block, or a pulse width of the demodulated signal is made almost equal to that of the outputted signals from each circuit block. Accordingly, it is possible to prevent an error or malfunction such as nonresponse which is caused due to difference in pulse width.

6 Claims, 17 Drawing Sheets

U.S. PATENT DOCUMENTS

| | | |
|---|---|---|
| 2002/0153997 A1 | 10/2002 | Nakane et al. |
| 2005/0174845 A1* | 8/2005 | Koyama et al. .......... 365/185.04 |
| 2006/0192019 A1 | 8/2006 | Kato et al. |

FOREIGN PATENT DOCUMENTS

| | | |
|---|---|---|
| EP | 1 058 376 A2 | 12/2000 |
| EP | 1 326 342 A1 | 7/2003 |
| EP | 1 231 557 B1 | 11/2005 |
| JP | 4-268818 | 9/1992 |
| JP | 7-29649 | 6/1995 |
| JP | 2001-125653 | 5/2001 |
| JP | 2001-344578 | 12/2001 |
| JP | 2002-198800 | 7/2002 |
| JP | 2002-236890 | 8/2002 |
| JP | 2002-319007 | 10/2002 |
| JP | 2003-188709 | 7/2003 |
| WO | WO 01/92970 A1 | 12/2001 |

OTHER PUBLICATIONS

International Search Report re application No. PCT/JP2006/310947, dated Sep. 19, 2006.

Written Opinion re application No. PCT/JP2006/310947, dated Sep. 19, 2006.

* cited by examiner

SEMICONDUCTOR DEVICE

TECHNICAL FIELD

The present invention relates to a semiconductor device capable of communicating data wirelessly. In addition, the present invention also relates to a semiconductor device in which data is only received or data is only transmitted.

BACKGROUND ART

As is called a ubiquitous information society, in recent years, an environment has been managed so that one can access the information network whenever and wherever he/she likes. In such an environment, an individual authentication technique is attracting attentions, such that an ID (identification number) is assigned to each object; therefore, the history of the object is clarified and the manufacturing, management, or the like is facilitated. In particular, an RFID (Radio Frequency Identification) technique with the use of a semiconductor device capable of communicating data wirelessly, such as an RFID tag (also referred to as an IC tag, an IC chip, an RF (Radio Frequency) tag, a wireless tag, an electronic tag, and a transponder), has come into use.

A general configuration of a semiconductor device capable of communicating data wirelessly will be explained with reference to FIG. 2.

A semiconductor device 101 capable of communicating data wirelessly includes an antenna 102 and a semiconductor integrated circuit 111. Circuits in the semiconductor device 101 are separated into an analog portion 914 and a digital portion 915. The semiconductor integrated circuit 111 has circuit blocks such as a high frequency circuit 103, a power supply circuit 104, a reset circuit 105, a clock generation circuit 106, a data demodulation circuit 107, a data modulation circuit 108, a control circuit 109, and a memory circuit 110. The power supply circuit 104 has a circuit block such as a rectifier circuit 112, a storage capacitor 113, and a constant voltage circuit 114.

Next, an operation of the semiconductor device 101 shown in FIG. 2 will be explained with reference to a timing chart of FIG. 3.

A wireless signal like A' in FIG. 3 is received from the antenna 102 in FIG. 2. The wireless signal A' is transmitted to the power supply circuit 104 through the high frequency circuit 103 in FIG. 2. The wireless signal A' is inputted into the rectifier circuit 112 in the power supply circuit 104. The wireless signal A' inputted into the rectifier circuit 112 is rectified and further smoothed by the storage capacitor 113. Accordingly, first high power supply potential (hereinafter, referred to as VDDH) is generated by the power supply circuit 104 (B' in FIG. 3). In addition, the power supply circuit 104 also generates second high power supply potential (hereinafter, referred to as VDD) from VDDH by the constant voltage circuit 114 (C' in FIG. 3). VDD is potential lower than VDDH. Note that, in a plurality of circuits constituting the semiconductor integrated circuit 111, low power supply potential (hereinafter, referred to as VSS) is in common, and GND can be used, for example. A first DC power supply voltage corresponding to a potential difference between VDDH and VSS and a second DC power supply voltage corresponding to a potential difference between VDD and VSS are supplied to the plurality of circuits (the analog portion and the digital portion) constituting the semiconductor integrated circuit 111. The first DC power supply voltage is a voltage higher than the second DC power supply voltage. Two of the DC power supply voltages which are different in voltage from each other (hereinafter, also referred to as two kinds of DC power supply voltages) are generated by the power supply circuit 104.

In addition, a signal transmitted to the data demodulation circuit 107 through the high frequency circuit 103 in FIG. 2 is demodulated like D' in FIG. 3 (a demodulated signal 911). The demodulated signal 911 is inputted into the clock generation circuit 106, and the clock generation circuit 106 outputs a clock 912. Further, a signal is inputted into the reset circuit 105 through the high frequency circuit 103, and the reset circuit 105 outputs a reset signal 913. The reset signal 913, the clock 912, and the demodulated signal 911 are transmitted to the control circuit 109. Then, the signals transmitted to the control circuit 109 are analyzed by the control circuit 109. According to the analyzed signals, information stored in the memory circuit 110 is outputted. The information outputted from the memory circuit 110 is encoded by the control circuit 109. Furthermore, the encoded signals are inputted into the data modulation circuit 108 and transmitted with the wireless signals by the antenna 102.

A configuration in which two kinds of DC power supply voltages are generated using the received wireless signals is described in Reference 1: Japanese Patent Application Laid-Open No. 2002-319007, for example.

DISCLOSURE OF INVENTION

In the semiconductor device 101 capable of communicating data wirelessly, the data demodulation circuit 107 is not supplied with VDD, and voltage amplitude of the demodulated signal 911 outputted from the data demodulation circuit 107 is almost the same as a potential difference between VDDH and VSS.

On the other hand, the clock generation circuit 106 and the control circuit 109 are supplied with VDD as high power supply potential. In addition, in the clock generation circuit 106 and the control circuit 109, one of the inputted signals is the demodulated signal 911.

Thus, in the clock generation circuit 106 and the control circuit 109, the voltage amplitude of the demodulated signal 911, which is one of the inputted signals differs from the supplied power supply voltage (the second DC power supply voltage: corresponding to the potential difference between VDD and VSS). Therefore, voltage amplitude and a pulse width of the inputted signals and signals in the circuits (the clock generation circuit 106 and the control circuit 109) are different, or voltage amplitude and a pulse width of the inputted signals and the outputted signals are different in the clock generation circuit 106 and the control circuit 109.

For example, a pulse width of an inputted signal into the clock generation circuit 106 and the control circuit 109 (corresponding to the demodulated signal 911) is referred to as T1 (D' in FIG. 3). In the signals in the clock generation circuit 106 and the control circuit 109 or the outputted signals of the clock generation circuit 106 and the control circuit 109, the voltage amplitude becomes the potential difference between VDD and VSS like E' in FIG. 3, and the pulse width becomes T1+α (α is a number that is not 0).

In the semiconductor device 101 as shown in FIG. 2, the circuits of the analog portion are supplied with the first DC power supply voltage (corresponding to the potential difference between VDDH and VSS), and the circuits of the digital portion is supplied with the second DC power supply voltage (corresponding to the potential difference between VDD and VSS), the voltage amplitude of which is lower than that of the first DC power supply voltage. A case where the output from a circuit supplied with a high power supply voltage (a circuit using the first DC power supply voltage as the power supply voltage) is inputted into a circuit supplied with a low power supply voltage (a circuit using the second DC power supply voltage as the power supply voltage) is considered. In this case, if a signal of a pulse width T1 is inputted into the circuit supplied with a low power supply voltage, outputted signals from the circuit has delay in pulse fall; thus, the pulse width becomes T1+α (α>0). On the other hand, a case where the output from the circuit supplied with a low power supply voltage (a circuit using the second DC power supply voltage as the power supply voltage) is inputted into the circuit supplied with a high power supply voltage (a circuit using the first DC power supply voltage as the power supply voltage) is considered. In this case, if a signal of a pulse width T1 is inputted into the circuit supplied with a high power supply voltage, the outputted signals from the circuit has delay in pulse rising; thus, the pulse width becomes T1+α (α<0).

Different from the pulse width T1 of the inputted signal like D' in FIG. 3, the reason why the pulse width of the signals in the clock generation circuit 106 and the control circuit 109 or the outputted signals of the clock generation circuit 106 and the control circuit 109 become T1+α like E' in FIG. 3 will be briefly explained. Generally, in two signals different in voltage amplitude, potential where "0" and "1" of one signal are switched is different from potential where "0" and "1" of the other signal are switched. Therefore, for example, when the circuits are operated by using one signal of these two signals as an inputted signal and using the same voltage as the voltage amplitude of the other signal as a power supply voltage, the timing that "0" and "1" of the outputted signals are switched is also changed compared with a case where the circuits are operated by using an inputted signal and a power supply voltage having the same voltage amplitude. Thus, the pulse width of the outputted signals is also changed. As mentioned above, when the voltage amplitude of the demodulated signal 911, which is one of the inputted signals, differs from the supplied power supply voltage in the clock generation circuit 106 and the control circuit 109, the voltage amplitude and the pulse width of the inputted signals and the signals in the circuits are different, or the voltage amplitude and the pulse width of the inputted signals and the outputted signals are different.

According to the above reason, the pulse width (T1) of the demodulated signal of D' in FIG. 3 differs from the pulse width (T1+α) of the outputted signals of E' in FIG. 3. In a semiconductor device capable of communicating data wirelessly, a pulse width of a signal is determined by a standard, and there is possibility that the semiconductor device 101 makes an error or such malfunction that the semiconductor device 101 does not respond occurs in a case where a pulse width of a signal differ greatly.

In view of the above situation, it is an object of the present invention to prevent an error or malfunction such as nonresponse which is caused due to a large difference in pulse width in a semiconductor device capable of communicating data wirelessly.

In order to solve the above problem, in a semiconductor device performing data communication wirelessly, a level shift circuit is provided between a circuit in which signals, the voltage amplitude of which is almost the same as that of a first DC power supply voltage, are outputted and a circuit supplied with a second DC power supply voltage, the voltage amplitude of which is lower than that of the first DC power supply voltage in the present invention. Note that the level shift circuit is supplied with both the first DC power supply voltage and the second DC power supply voltage. Note that the present invention is not limited to a semiconductor device performing data communication wirelessly, and a semiconductor device performing only data reception wirelessly or a semiconductor device performing only data transmission wirelessly may be employed instead.

In particular, in a semiconductor device performing data communication wirelessly, a level shift circuit is provided between a data demodulation circuit and a circuit to which a signal (demodulated signal) outputted from the data demodulation circuit is transmitted (hereinafter, also referred to as a circuit block). The circuit block refers to a group of a plurality of circuits in which a predetermined function is fulfilled as a whole. Note that the present invention is not limited to a semiconductor device performing data communication wirelessly and a semiconductor device performing only data reception wirelessly may be employed instead.

Accordingly, voltage amplitude and a pulse width of a demodulated signal are made almost equal to those of signals in each circuit block to which the demodulated signal is transmitted, or voltage amplitude and a pulse width of the demodulated signal are made almost equal to those of outputted signals from each circuit block.

For example, in a case where a circuit to which a demodulated signal is transmitted is a control circuit, the following structure is employed. A semiconductor device includes a data demodulation circuit where a wireless signal is demodulated, a level shift circuit where an outputted signal of the data demodulation circuit is inputted, and a control circuit where output of the level shift circuit is inputted. The voltage amplitude of the outputted signals of the data demodulation circuit becomes the same as the first DC power supply voltage. The level shift circuit is supplied with the first DC power supply voltage and the second DC power supply voltage, the voltage amplitude of which is lower than that of the first DC power supply voltage. The control circuit is supplied with the second DC power supply voltage. The inputted signal inputted into the level shift circuit is the outputted signal of the data demodulation circuit; therefore, the voltage amplitude is the same as that of the first DC power supply voltage. The level shift circuit outputs the voltage amplitude of the inputted signal after conversion. Accordingly, the voltage amplitude of the signal outputted from the level shift circuit is the same as that of the second DC power supply voltage.

In a semiconductor device performing data communication wirelessly, voltage amplitude and a pulse width of a demodulated signal are made almost equal to those of signals in each circuit block, or voltage amplitude and a pulse width of the demodulated signal are made almost equal to those of outputted signals from each circuit block. Accordingly, it is possible to obtain a semiconductor device in which an error or malfunction such as nonresponse can be prevented and information stored in a memory circuit can be transmitted precisely, as compared with a conventional semiconductor device.

BEST MODE FOR CARRYING OUT THE INVENTION

Figure 1:
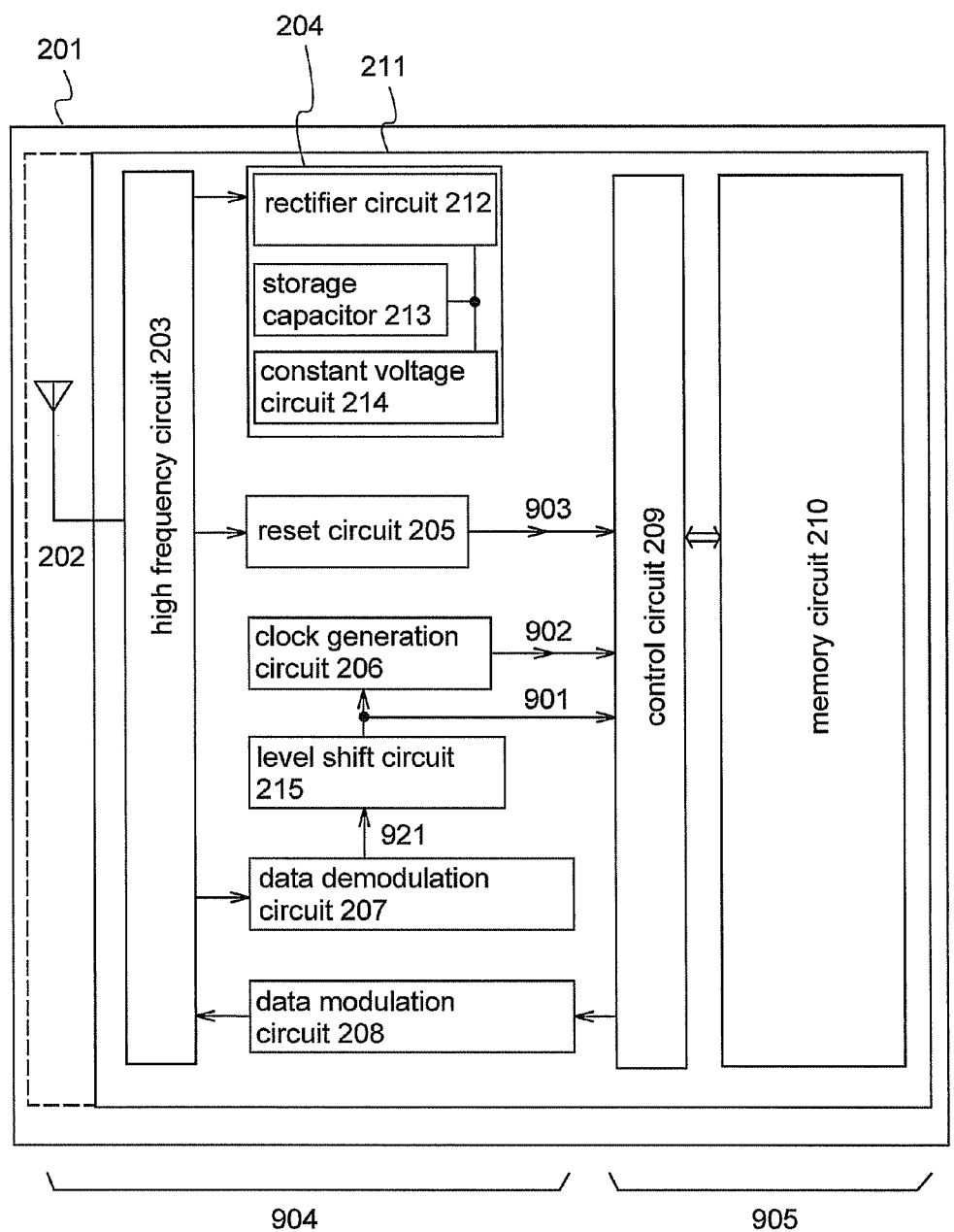
FIG. 1 is a diagram explaining Embodiment Mode 1 and Embodiment Mode 2 according to the present invention.
Figure 2:
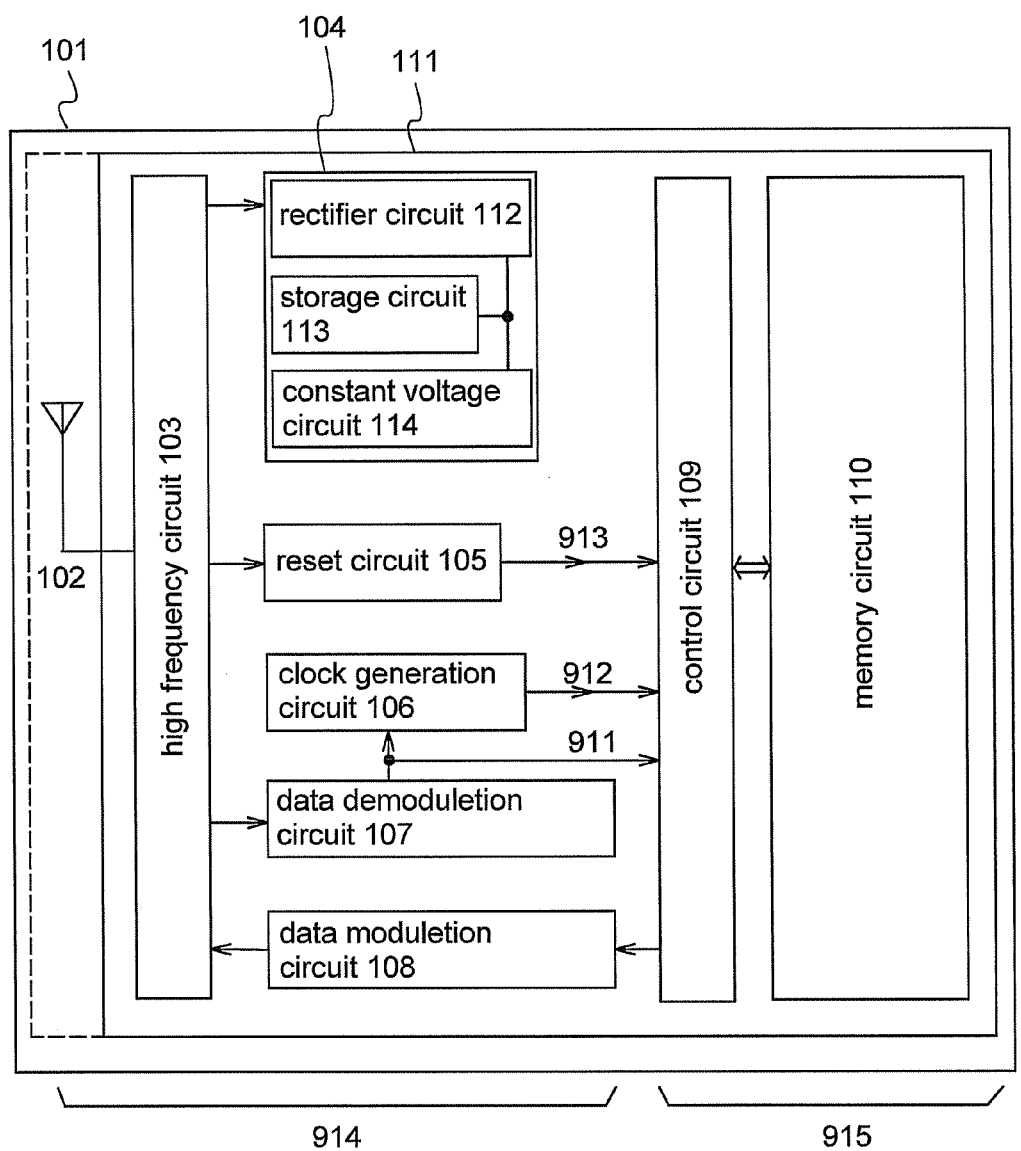
FIG. 2 is a diagram explaining a conventional configuration.
Figure 3:
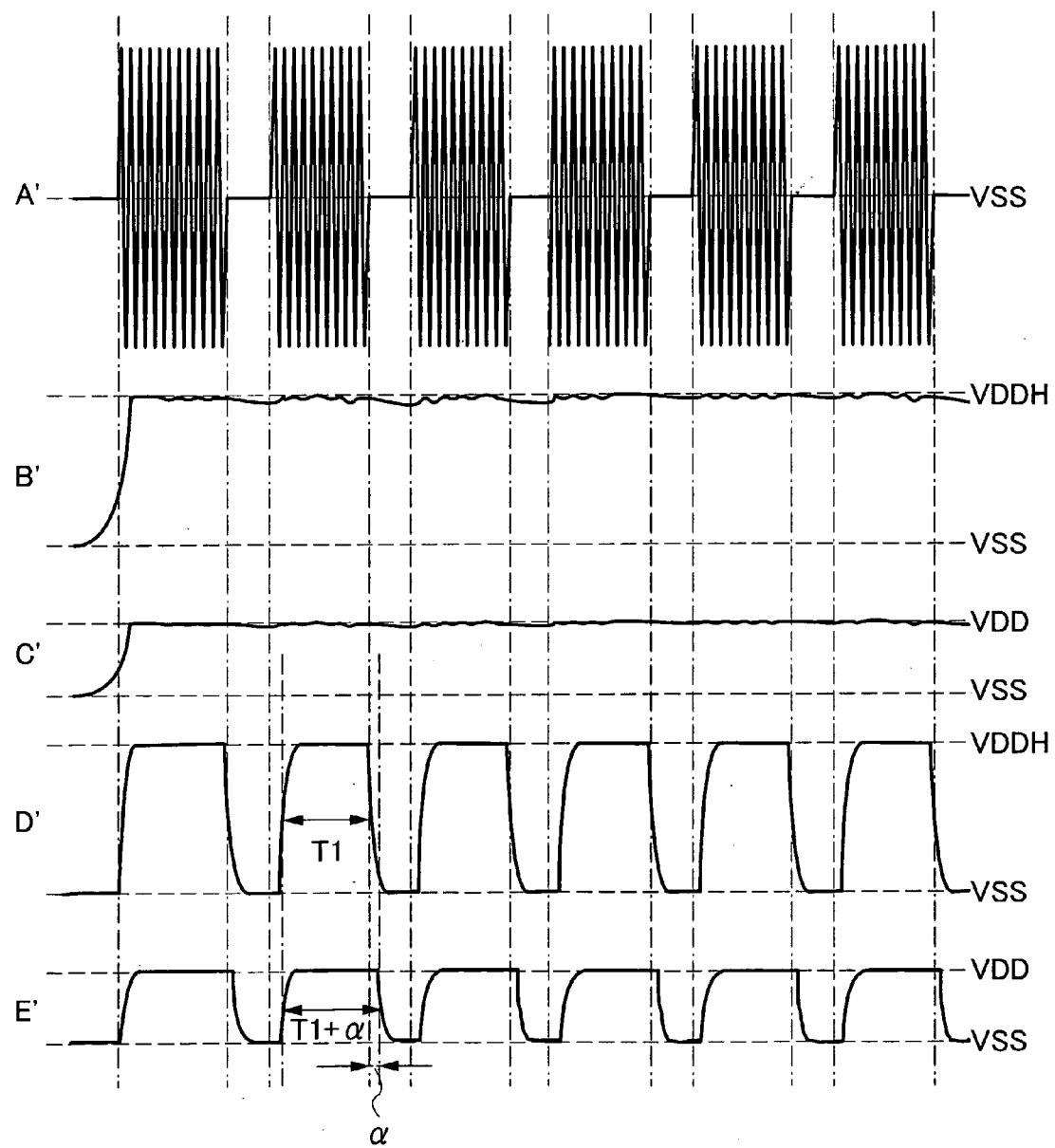
FIG. 3 is a diagram explaining a conventional configuration.

Embodiment Modes of the present invention will be explained below with reference to drawings. However, it is to be easily understood that various changes and modifications will be apparent to those skilled in the art. Therefore, unless such changes and modifications depart from the scope of the present invention, they should be construed as being included therein. Note that identical portions in a structure of the present invention which will be explained below are denoted by the same reference numerals in different drawings.

Embodiment Mode 1

In Embodiment Mode 1, a structure of a semiconductor device capable of communicating data wirelessly according to the present invention and an operation of the semiconductor device will be explained.

First, a structure of a semiconductor device capable of communicating data wirelessly according to the present invention is shown in FIG. 1. A semiconductor device 201 has an antenna 202 and a semiconductor integrated circuit 211. The circuits in the semiconductor device 201 are separated into an analog portion and a digital portion.

As the antenna 202, any of a dipole antenna, a patch antenna, a loop antenna, and a Yagi antenna can be used.

In addition, as a method for transmitting and receiving a wireless signal in the antenna 202, any of an electromagnetic coupling method, an electromagnetic induction method, and an electromagnetic wave method may be used.

The semiconductor integrated circuit 211 has a circuit block such as a high frequency circuit 203, a power supply circuit 204, a reset circuit 205, a clock generation circuit 206, a level shift circuit 215, a data demodulation circuit 207, a data modulation circuit 208, a control circuit 209, and a memory circuit 210. The power supply circuit 204 has a circuit block such as a rectifier circuit 212, a storage capacitor 213, and a constant voltage circuit 214.

An analog portion 904 includes the antenna 202, the high frequency circuit 203, the power supply circuit 204, the reset circuit 205, the clock generation circuit 206, the level shift circuit 215, the data demodulation circuit 207, the data modulation circuit 208, and the like, and a digital portion 905 includes the control circuit 209, the memory circuit 210, and the like.

Next, an operation of the semiconductor device 201 will be explained. A wireless signal that is received by the antenna 202 is transmitted to each circuit block through the high frequency circuit 203. A signal transmitted to the power supply circuit 204 through the high frequency circuit 203 is inputted into the rectifier circuit 212. The signal is rectified and further smoothed by the storage capacitor 213. Accordingly, first high power supply potential (VDDH) is generated. VDDH is inputted into the constant voltage circuit 214 and second high power supply potential (VDD) is generated. VDD is potential lower than VDDH.

Note that, in a DC power supply voltage of a plurality of circuit blocks constituting the semiconductor integrated circuit 211, low power supply potential (hereinafter, VSS) is in common, and GND can be used for VSS. A first DC power supply voltage corresponding to a potential difference between VDDH and VSS and a second DC power supply voltage corresponding to a potential difference between VDD and VSS are supplied to the plurality of circuit blocks constituting the semiconductor integrated circuit 211 (the analog portion 904 and the digital portion 905). The first DC power supply voltage is a voltage higher than the second DC power supply voltage. A plurality of DC power supply voltages which are different in voltage from each other (hereinafter, also referred to as a plurality of kinds of DC power supply voltages) are generated by the power supply circuit 204.

In addition, a signal transmitted to the data demodulation circuit 207 through the high frequency circuit 203 is demodulated (a demodulated signal 921). Further, the demodulated signal 921 is transmitted to the level shift circuit 215. Furthermore, a signal is inputted into the reset circuit 205 through the high frequency circuit 203, and the reset circuit 205 outputs a reset signal 903.

Herein, the level shift circuit 215, the clock generation circuit 206, and the control circuit 209 are each supplied with the second DC power supply voltage (corresponding to a potential difference between VDD and VSS). In addition, the level, shift circuit 215 is also supplied with the first DC power supply voltage (corresponding to a potential difference between VDDH and VSS).

The voltage amplitude of the demodulated signal 921 is equal to or more than the voltage amplitude of the outputted signals of the level shift circuit 215. The demodulated signal 921 is level shifted so that the voltage amplitude is reduced by the level shift circuit 215 and transmitted to the clock generation circuit 206 and the control circuit 209. In the clock generation circuit 206 and the control circuit 209, a signal, the voltage amplitude of which becomes almost the same as that of the second DC power supply voltage (corresponding to a potential difference between VDD and VSS) by the level shift circuit 215 (a level shifted demodulated signal 901), is inputted. In other words, the level shift circuit 215 outputs the demodulated signal by converting the demodulated signal into a signal (the level shifted demodulated signal 901), the voltage amplitude of which becomes almost the same as that of the second DC power supply voltage (a potential difference between VDD and VSS).

The level shifted demodulated signal 901 is inputted into the clock generation circuit 206, and the clock generation circuit 206 outputs a clock 902. A reset signal 903, the clock 902 and the level shifted demodulated signal 901 are transmitted to the control circuit 209.

The voltage amplitude of the signals in the clock generation circuit 206 and the control circuit 209 or the voltage amplitude of the outputted signals from the clock generation circuit 206 and the control circuit 209 becomes to have few differences from the supplied power supply voltage (the second DC power supply voltage: corresponding to a potential difference between VDD and VSS). Accordingly, large difference between the pulse width of the inputted signals and the pulse width of signals in the circuit or between the pulse width of the inputted signals and the pulse width of the outputted signals can be prevented in the clock generation circuit 206 and the control circuit 209.

In a wireless communication system using a semiconductor device according to the present invention, a semiconductor device 201, a reader/writer of a known structure, an antenna connected to the reader/writer, and a control terminal for controlling the reader/writer can be used. A communication method of the semiconductor device 201 and the antenna connected to the reader/writer is a one-way communication or two-way communication, and any of a space division multiplex access method, a polarization division multiplex access method, a frequency-division multiplex access method, a time-division multiplex access method, a code division multiplex access method, and an orthogonal frequency division multiplexing method can also be used.

A wireless signal is a signal in which a carrier wave is modulated. Modulation of a carrier wave is an analog modulation or a digital modulation, which may be any of an amplitude modulation, a phase modulation, a frequency modulation, and spectrum diffusion.

The frequency of a carrier wave can employ any of a sub-millimeter wave of 300 GHz or more and 3 THz or less, an extremely-high-frequency wave of 30 GHz or more and less than 300 GHz, a micro wave of more than 3 GHz and less than 30 GHz, an ultra-high-frequency wave of 300 MHz or more and less than 3 GHz, a very-high-frequency wave of 30 MHz or more and less than 300 MHz, a high-frequency wave of 3 MHz or more and less than 30 MHz, a medium-frequency wave of 300 kHz or more and less than 3 MHz, a long-frequency wave of 30 kHz or more and less than 300 kHz, and a very-long frequency wave of 3 kHz or more and less than 30 kHz.

As the memory circuit 210, a DRAM (Dynamic Random Access Memory), a SRAM (Static Random Access Memory), a FeRAM (Ferroelectric Random Access Memory), a mask ROM (Read Only Memory), an EPROM (Electrically Programmable Read Only Memory), an EEPROM (Electrically Erasable and Programmable Read Only Memory), or a flash memory can be used.

According to the above structure, in a semiconductor device capable of communicating data wirelessly according to the present invention, an error or malfunction such as nonresponse can be prevented and information stored in a memory circuit can be transmitted precisely, as compared with a conventional semiconductor device.

Embodiment Mode 2

In Embodiment Mode 2, an operation of a semiconductor device according to the present invention having the structure shown in FIG. 1 will be explained with reference to a timing chart in FIG. 4.

Figure 4:
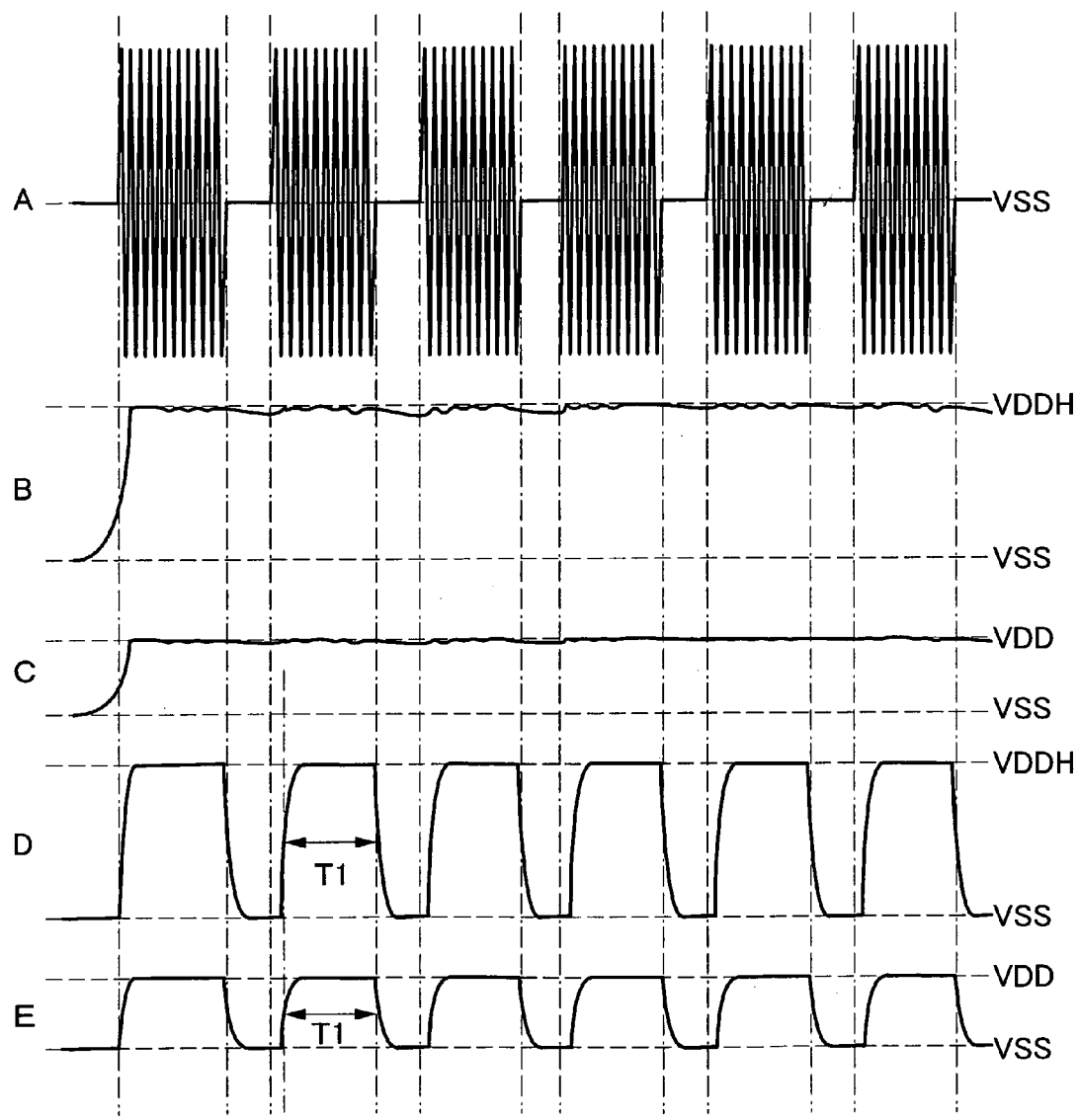
FIG. 4 is a diagram explaining Embodiment Mode 2 according to the present invention.

A wireless signal like A in FIG. 4 is received from the antenna 202 in FIG. 1. The wireless signal A is transmitted to the power supply circuit 204 through the high frequency circuit 203 in FIG. 1. The wireless signal transmitted to the power supply circuit 204 is inputted into the rectifier circuit 212. Accordingly, the wireless signal A is rectified and further smoothed by the storage capacitor 213. Then, first high power supply potential (VDDH) is generated like B in FIG. 4. The first high power supply potential (VDDH) is inputted into the constant voltage circuit 214 to generate second high power supply potential (VDD) like C in FIG. 4. In addition, the signals transmitted to the data demodulation circuit 207 through the high frequency circuit 203 in FIG. 1 are demodulated like D in FIG. 4 (the demodulated signal 921). Further, the demodulated signal 921 is transmitted to the level shift circuit 215.

Herein, the level shift circuit 215, the clock generation circuit 206, and the control circuit 209 are each supplied with a power supply voltage (the second DC power supply voltage: corresponding to a potential difference between VDD and VSS) like C in FIG. 4. In addition, the level shift circuit 215 is also supplied with the first DC power supply voltage (corresponding to a potential difference between VDDH and VSS). Note that the pulse width of the demodulated signal 921 is different depending on a received signal (a wireless signal received from the antenna 202) and is not constant. In FIG. 4, a pulse width of the demodulated signal 921 is referred to as T1. In addition, the voltage amplitude of the demodulated signal 921 is almost the same as the potential difference between VDDH and VSS like D in FIG. 4.

Next, a signal that is level shifted so as to reduce the voltage amplitude of the demodulated signal 921 by the level shift circuit 215 (E in FIG. 4: corresponding to the level shifted demodulated signal 901 in FIG. 1) is transmitted to the clock generation circuit 206 and the control circuit 209. In the signal E in FIG. 4, the voltage amplitude is a potential difference between VDD and VSS and the pulse width is almost T1.

The voltage amplitude of the signals in the clock generation circuit 206 and the control circuit 209 or the voltage amplitude of the outputted signals from the clock generation circuit 206 and the control circuit 209 becomes to have few differences from the supplied power supply voltage (a potential difference between VDD and VSS). Accordingly, large difference between the pulse width of the inputted signals and the pulse width of signals in the circuit or between the pulse width of the inputted signals and the pulse width of the outputted signals can be prevented in the clock generation circuit 206 and the control circuit 209.

According to the above structure, in a semiconductor device capable of communicating data wirelessly according to the present invention, an error or malfunction such as nonresponse can be prevented and information stored in a memory circuit can be transmitted precisely, as compared with a conventional semiconductor device.

This embodiment mode can be implemented by arbitrarily combined with Embodiment Mode 1.

Embodiment Mode 3

In Embodiment Mode 3, a level shift circuit which is a configuration element of a semiconductor device according to the present invention will be explained.

Figure 5A:
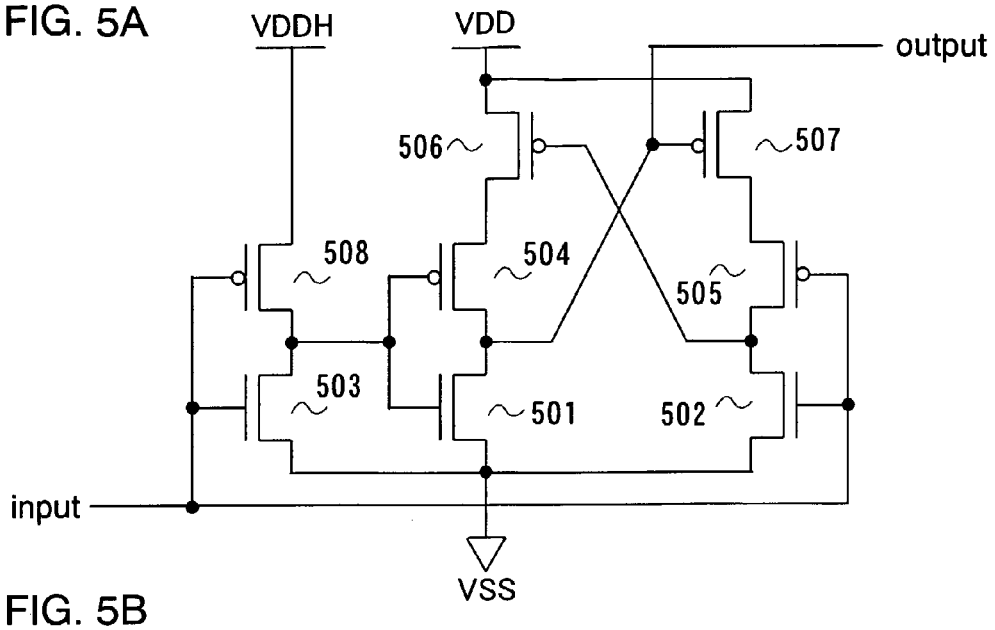
FIGS. 5A to 5C are diagrams each explaining Embodiment Mode 3 according to the present invention.

An example of the level shift circuit is shown in FIG. 5A. In FIG. 5A, a level shift circuit has transistors 501, 502, and 503 which are N-channel transistors, and transistors 504, 505, 506, 507, and 508 which are P-channel transistors. A source in each of the transistors 501 and 502 is provided with low power supply potential (VSS). A drain of the transistor 501 is connected to a drain of the transistor 504 and a gate of the transistor 507. A source of the transistor 504 is connected to a drain of the transistor 506. Sources of the transistors 506 and 507 are provided with second high power supply potential (VDD). A drain of the transistor 507 is connected to a source of the transistor 505. A drain of the transistor 505 is connected to a gate of the transistor 506 and a drain of the transistor 502. Gates of the transistors 501 and 504 connected to each other are connected to drains of the transistors 508 and 503. A source of the transistor 508 is provided with first high power supply potential (VDDH), and a source of the transistor 503 is provided with low power supply potential (VSS). Gates of the transistors 502, 503, 505, and 508 are connected to each other, which serve as inputs of the level shift circuit. In addition, the drains of the transistors 501 and 504, and the gate of the transistor 507 serve as outputs of the level shift circuit.

Note that the level shift circuit is not limited to the circuit shown in FIG. 5A. The name of the circuit is not limited to the level shift circuit. Any of a circuit configuration may be employed as long as a circuit has different voltage amplitude between inputted signals and outputted signals, and the voltage amplitude of the inputted signals is outputted by being level shifted to the same voltage amplitude as that of the power supply voltage that is supplied to the circuits.

Figure 5B:
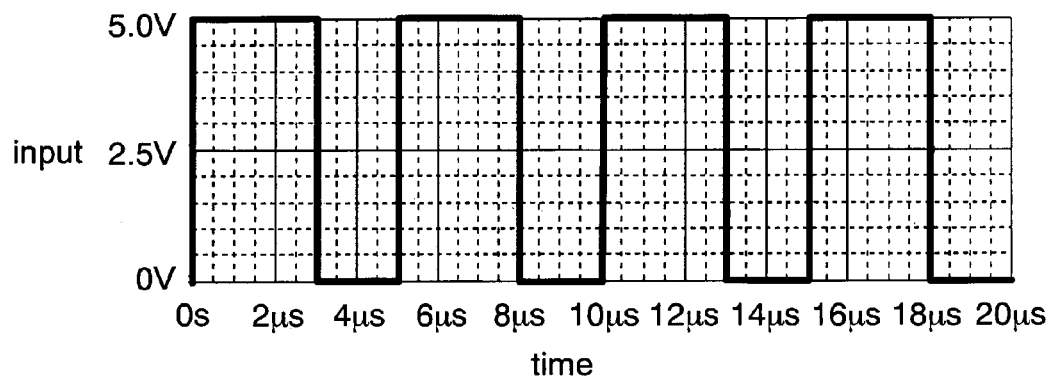
Figure 5C:
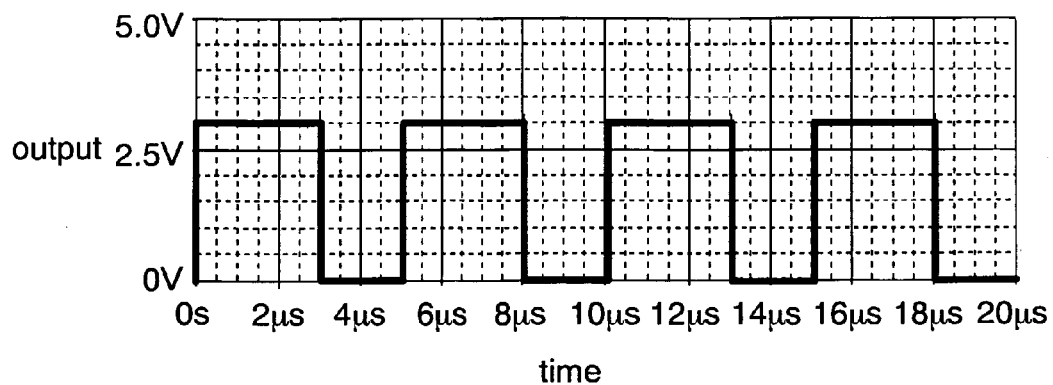

In the level shift circuit in FIG. 5A, a calculation result when the voltage amplitude of inputted signals is 5V, VDDH is 5V, VDD is 3V, and VSS is GND (0V) is shown in FIGS. 5B and 5C.

In FIG. 5B, the voltage amplitude of inputted signals is 5V, a cycle is approximately 5 μs (approximately 3 μs+approximately 2 μs), and a frequency is approximately 20 kHz. In FIG. 5C, the voltage amplitude of outputted signals is 3V, and a cycle and a frequency are almost the same as those of inputted signals. In other words, the voltage amplitude of outputted signals becomes almost the same as that of the power supply voltage provided to the circuits by scarcely changing the pulse width of inputted signals and outputted signals.

The demodulated signal outputted from the data demodulation circuit 207 is converted into a signal with small voltage amplitude and transmitted to the clock generation circuit 206 and the control circuit 209 by the level shift circuit 215 as mentioned above. Thus, the voltage amplitude of the signals in the clock generation circuit 206 and the control circuit 209 or the voltage amplitude of the outputted signals from the clock generation circuit 206 and the control circuit 209 becomes to have few differences with the supplied voltage amplitude (corresponding to a potential difference between VDD and VSS). Accordingly, large difference between the pulse width of the inputted signals and the pulse width of signals in the circuit or between the pulse width of the inputted signals and the pulse width of the outputted signals can be prevented in the clock generation circuit 206 and the control circuit 209.

According to the above structure, in a semiconductor device capable of communicating data wirelessly according to the present invention, an error or malfunction such as nonresponse can be prevented and information stored in a memory circuit can be transmitted precisely, as compared with a conventional semiconductor device.

This embodiment mode can be implemented by arbitrarily combined with Embodiment Modes 1 and 2.

Embodiment Mode 4

In Embodiment Mode 4, a mask layout for manufacturing a semiconductor device according to the present invention will be explained.

Figure 6:
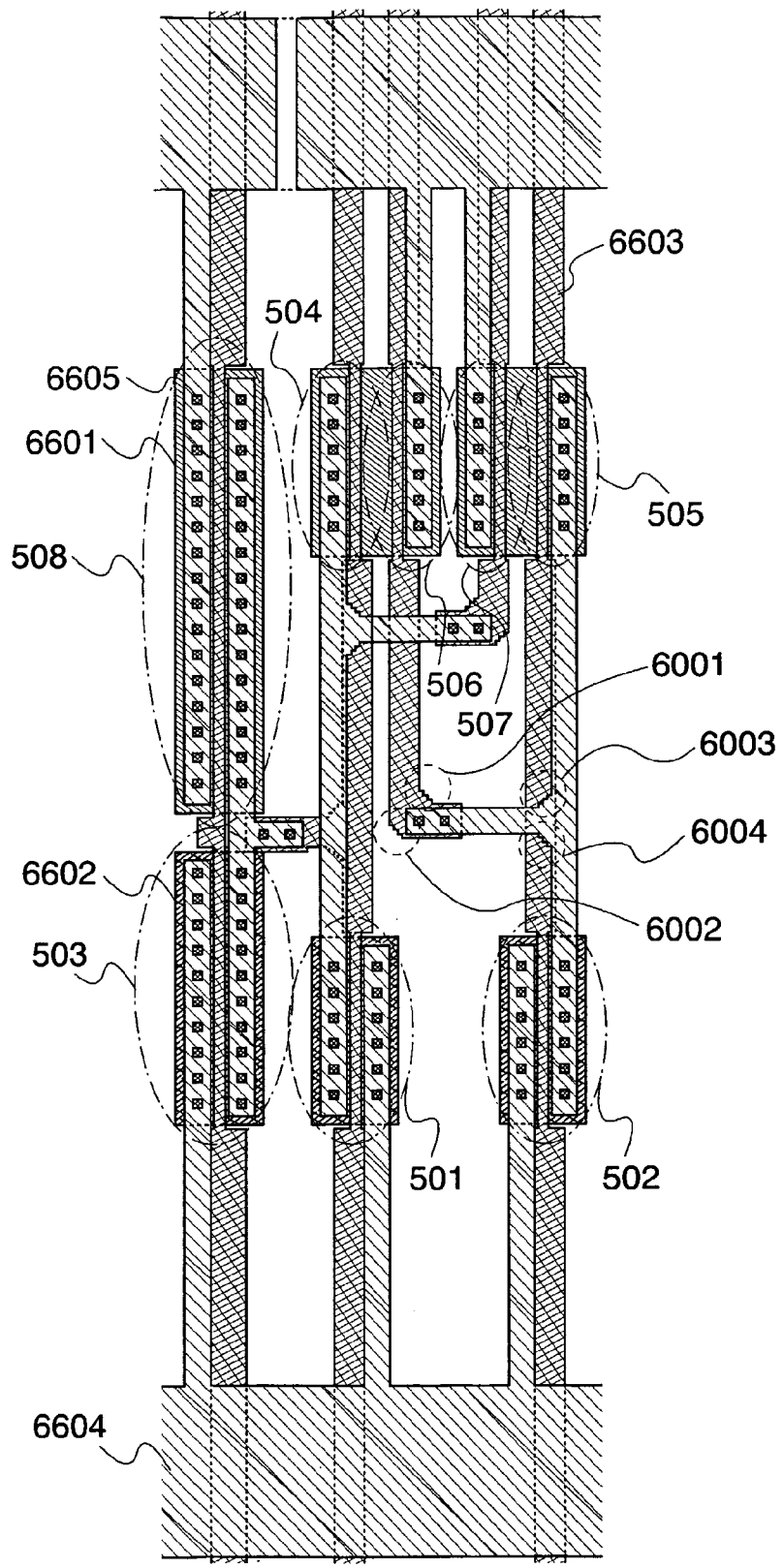
FIG. 6 is a view explaining Embodiment Mode 4 according to the present invention.

Part of a mask layout for manufacturing a semiconductor device capable of communicating data wirelessly according to the present invention is shown in FIG. 6. The mask layout shown in FIG. 6 corresponds to a circuit diagram of FIG. 5A shown in Embodiment Mode 3. In FIG. 6, portions identical to those in FIG. 5A are denoted by the same reference numerals. Note that, as the mask layout, drawings corresponding to semiconductor layers (semiconductor layers 6601 and 6602) each of which becomes an active layer of a transistor, a first conductive layer 6603 which becomes a gate electrode, a second conductive layer 6604 which becomes an electrode or a wiring connected to a source or a drain, and a contact hole 6605 that connects the semiconductor layers and the second conductive layer 6604 are typically shown. The semiconductor layer 6601 becomes an active layer of a P-channel transistor, and the semiconductor layer 6602 becomes an active layer of an N-channel transistor.

A characteristic of the mask layout shown in FIG. 6 is that a corner of an electrode or a wiring (corners 6001, 6002, 6003, and 6004 in FIG. 6 are typically shown) is chamfered in a stepped manner. The stepped chamfer is 10 μm or less or a length that is ⅕ or more and ½ or less of a line width of the wiring. A mask pattern is manufactured using this mask layout and etching processing of a conductive film is performed using the mask pattern to form the electrode or the wiring. Accordingly, a shape in which a corner of a pattern of the electrode or the wiring is chamfered can be obtained. Note that the corner of the pattern of the electrode or the wiring may be further rounded. In other words, by setting an exposure condition and an etching condition appropriately, the pattern shape of the wiring may be smoothed more than the mask layout. Thus, the wiring in which a corner becomes round is formed.

When a corner of a bent portion or a portion in which a line width changes is smoothed and rounded in the wiring and the electrode, there are following effects. When dry etching using plasma is performed by chamfering a convex portion (the corner 6002 in FIG. 6), generation of fine particles due to discharging can be suppressed. Even if fine particles are generated, the fine particles are prevented from gathering at the corner at the time of cleaning, and the fine particles can be washed away by chamfering a convex portion. Thus, a problem of fine particles or dust in manufacturing process can be solved and yield can be improved.

Although a structure in which part of the corners of the electrode and the wiring which are formed using the first conductive layer 6603 and the second conductive layer 6604 is chamfered is shown in FIG. 6, the present invention is not limited thereto. It is also possible to apply the above chamfer structure to all corners. In addition, it is also possible to apply the above chamfer structure to an electrode and a wiring which are formed using another conductive layer.

Further, it is also possible to apply the above structure of the wiring and the electrode in manufacturing another circuit of a semiconductor device according to the present invention, as well as the level shift circuit.

This embodiment mode can be implemented by arbitrarily combined with Embodiment Modes 1 to 3.

Embodiment Mode 5

In Embodiment Mode 5, a manufacturing process of a semiconductor device capable of communicating data wirelessly according to the present invention will be explained with reference to FIGS. 7A to 7D, FIGS. 10A to 10D, and FIGS. 12A and 12B.

Figure 7A:
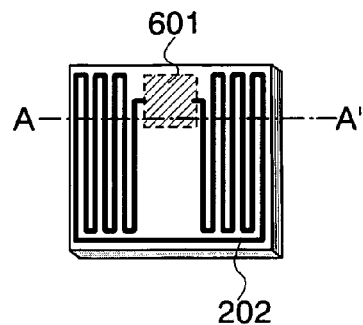
FIGS. 7A to 7D are views each explaining Embodiment Mode 5 according to the present invention.
Figure 7B:
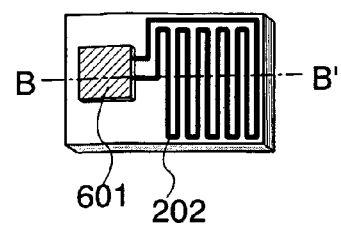
Figure 7C:
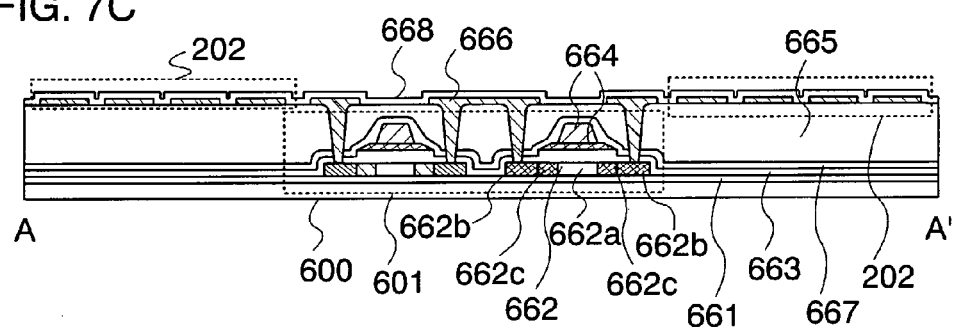
Figure 7D:
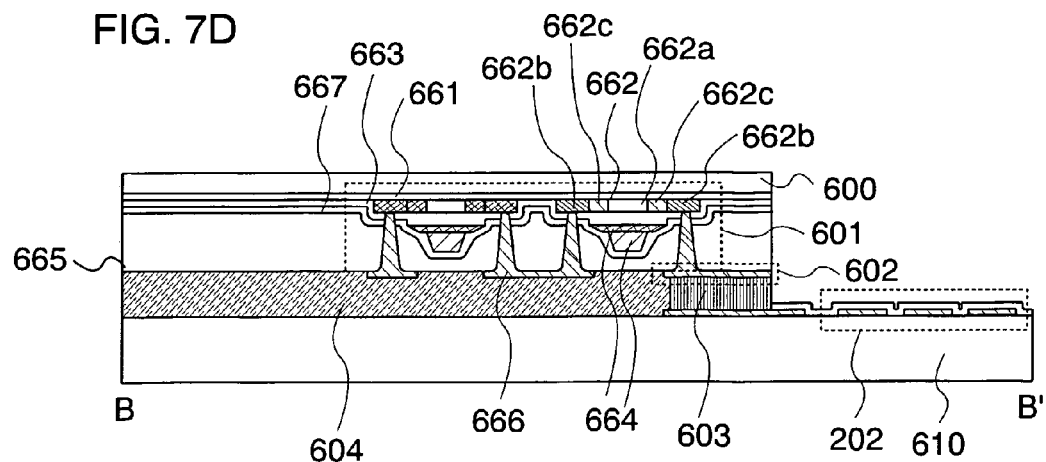

FIGS. 7A to 7D show configuration examples of the antenna 202 in the semiconductor device 201 shown in FIG. 1. The antenna 202 can be provided in two ways. FIGS. 7A and 7C show one way (hereinafter, referred to as a first antenna configuration) while FIGS. 7B and 7D show the other way (hereinafter, referred to as a second antenna configuration). FIG. 7C corresponds to a cross-sectional view taken along A-A' in FIG. 7A, and FIG. 7D corresponds to a cross-sectional view taken along B-B' in FIG. 7B.

In the first antenna configuration, the antenna 202 is provided over a substrate 600 provided with a plurality of elements (hereinafter, referred to as an element group 601) (see FIGS. 7A and 7C). The element group 601 forms circuits other than the antenna of the semiconductor device according to the present invention. The element group 601 includes a plurality of thin film transistors. In the shown configuration, a conductive film which serves as the antenna 202 is provided in the same layer as a wiring connected to a source or a drain of the thin film transistor in the element group 601. However, the conductive film which serves as the antenna 202 may be provided in the same layer as a gate electrode 664 of the thin film transistor in the element group 601, or over an insulating film which is provided so as to cover the element group 601.

In the second antenna configuration, a terminal portion 602 is provided over the substrate 600 provided with the element group 601. Then, the antenna 202 provided over a substrate 610 which is a different substrate from the substrate 600 is connected to the terminal portion 602 (see FIGS. 7B and 7D). In the shown configuration, part of a wiring connected to a source or a drain of the thin film transistor in the element group 601 is used as the terminal portion 602. Then, the substrate 600 and the substrate 610 provided with the antenna 202 are attached to each other so as to be connected at the terminal portion 602. A conductive particle 603 and a resin 604 are provided between the substrate 600 and the substrate 610. The antenna 202 and the terminal portion 602 are electrically connected by the conductive particle 603.

A configuration and a manufacturing method of the element group 601 will be explained. Formed over a large substrate in a plural numbers and divided later to be completed by cutting, the element groups 601 can be inexpensively provided. As the substrate 600, for example, a glass substrate such as barium borosilicate glass and alumino borosilicate glass, a quartz substrate, a ceramic substrate, or the like can be used. In addition, a semiconductor substrate over which an insulating film is formed may be used as well. A substrate formed of a synthetic resin having flexibility such as plastic may also be used. The surface of the substrate may be planarized by polishing by a CMP method or the like. Moreover, a substrate which is formed thin by polishing a glass substrate, a quartz substrate, or a semiconductor substrate may be used as well.

As a base film 661 provided over the substrate 600, an insulating film such as silicon oxide, silicon nitride, or silicon nitride oxide can be used. The base film 661 can prevent an alkali metal such as Na or an alkaline earth metal contained in the substrate 600 from dispersing into a semiconductor layer 662 and adversely affecting the characteristics of the thin film transistor. In FIGS. 7A to 7D, the base film 661 is formed of a single layer; however, it may be formed of two or more layers. Note that the base film 661 is not always required to be provided when the dispersion of impurities is not a big problem, such as the case of using a quartz substrate.

Note that high-density plasma may be directly applied to the surface of the substrate 600. The high-density plasma is, for example, generated by using a high frequency of 2.45 GHz. Note that high-density plasma with an electron density of $10^{11}$ to $10^{13}$ cm$^{-3}$, an electron temperature of 2 eV or less, and an ion energy of 5 eV or less is used. In this manner, high-density plasma which features low electron temperature has low kinetic energy of active species; therefore, a film with less plasma damage and defects can be formed as compared to conventional plasma treatment. Plasma can be generated by using a plasma processing apparatus utilizing a radio frequency excitation, which employs a radial slot antenna. The antenna which generates a radio frequency and the substrate 600 are placed at a distance of 20 to 80 mm (preferably, 20 to 60 mm).

By performing the high-density plasma treatment in an atmosphere containing nitrogen (N) and rare gas (containing at least one of He, Ne, Ar, Kr, and Xe), an atmosphere containing nitrogen, hydrogen (H), and rare gas, or an atmosphere containing ammonium ($NH_3$) and rare gas, the surface of the substrate 600 can be nitrided. In the case where the substrate 600 is formed of glass, quartz, a silicon wafer, or the like, a nitride layer formed over the surface of the substrate 600 containing silicon nitride as a main component can be used as a blocking layer against impurities which are dispersed from the substrate 600 side. A silicon oxide film or a silicon oxynitride film may be formed over the nitride layer by a plasma CVD method to be used as the base film 661.

By applying similar high-density plasma treatment to the surface of the base film 661 formed of silicon oxide or silicon oxynitride, the surface and a depth of 1 to 10 nm from the surface can be nitrided. This extremely thin silicon nitride layer is favorable because it functions as a blocking layer and has less stress on the semiconductor layer 662 formed thereover.

A crystalline semiconductor film or an amorphous semiconductor film can be used as the semiconductor layer 662. Moreover, an organic semiconductor film may also be used. A crystalline semiconductor film can be obtained by crystallizing an amorphous semiconductor film. A laser crystallization method, a thermal crystallization method using RTA or an annealing furnace, a thermal crystallization method using a metal element which promotes crystallization, or the like can be used as the crystallization method. The semiconductor layer 662 includes a channel formation region 662a and a pair of impurity regions 662b to which impurity elements which impart conductivity are added. Shown here is a structure where a low concentration impurity region 662c to which the impurity elements are added at a lower concentration than to the impurity regions 662b is provided between the channel formation region 662a and the pair of impurity regions 662b; however, the present invention is not limited thereto. The low concentration impurity region 662c is not necessarily provided.

Figure 12A:
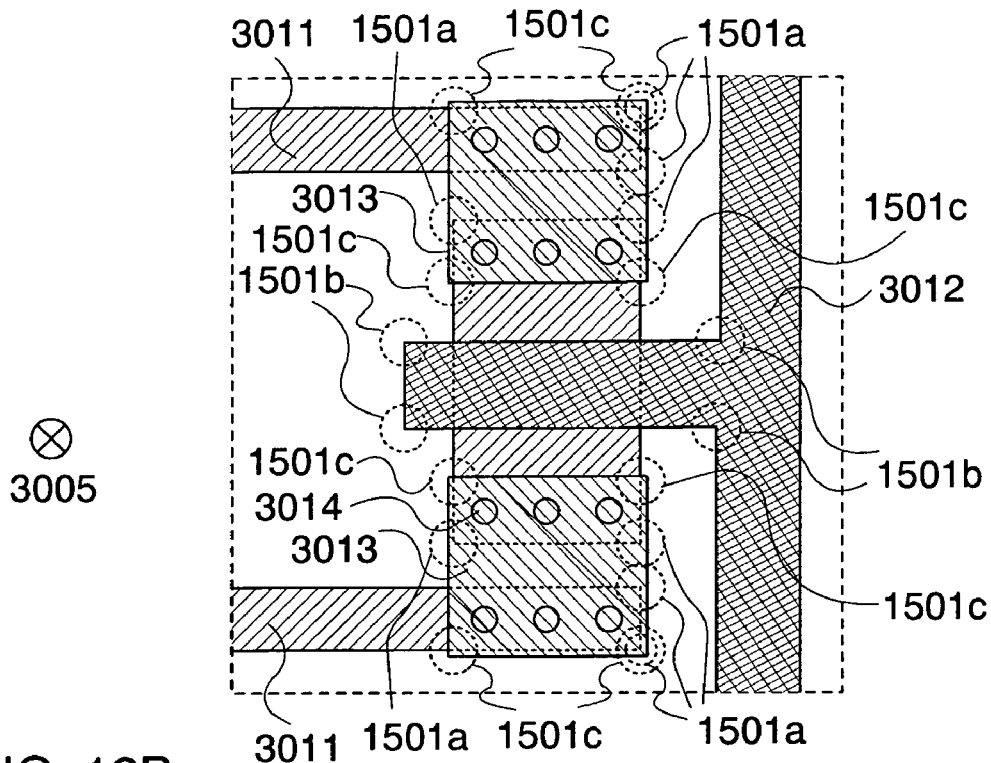
FIGS. 12A and 12B are views each explaining a method for leading a wiring.
Figure 12B:
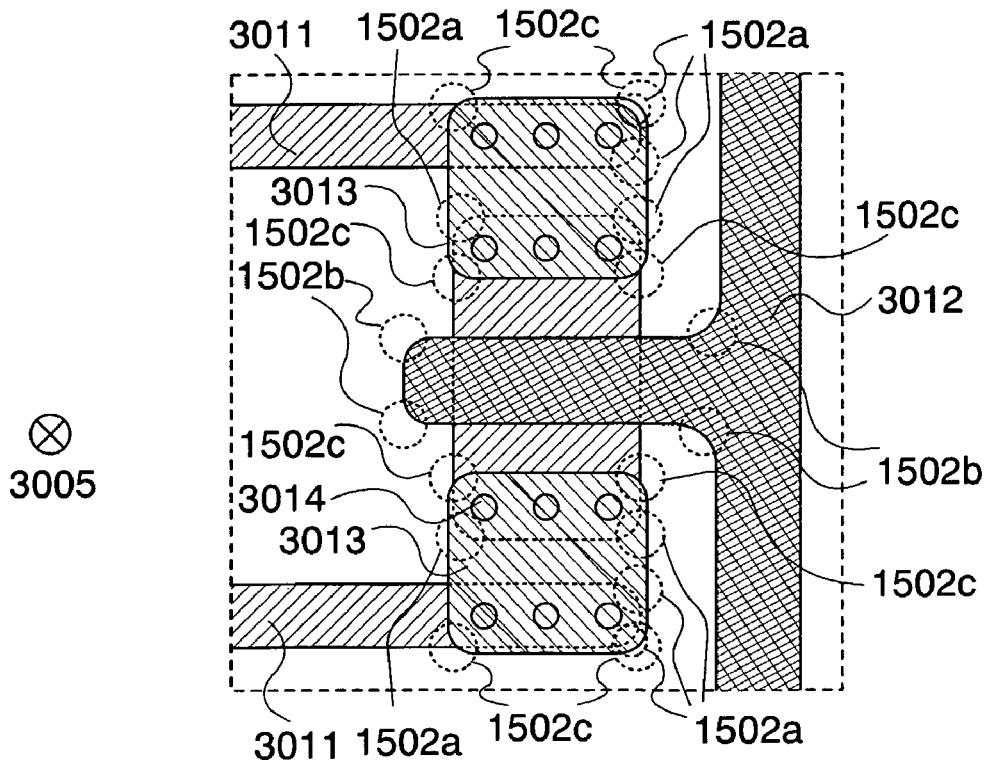

Note that the semiconductor layer 662 and a wiring which is formed simultaneously with these semiconductor layers are preferably lead so that corners are rounded when seen in a direction 3005 perpendicular to the top surface of the substrate 600. FIGS. 12A and 12B are schematic views showing the method for leading the wirings. Wirings 3011 are formed simultaneously with the semiconductor layer 662 in the figures. FIG. 12A shows a conventional method for leading wirings. FIG. 12B shows a method of the present invention to lead wirings. Corner portions 1502a of the wiring 3011 of the present invention are rounded as compared to corner portions 1501a of the conventional wiring 3011. The mask layout as shown in Embodiment Mode 4 may be used to have the rounded corner portions. The rounded corner portions can prevent dusts or the like from remaining at the corner portions of the wiring. In this manner, defects of a semiconductor device caused by dusts can be reduced and the yield can be improved.

Impurity elements which impart conductivity may be added to the channel formation region 662a of the thin film transistor. In this manner, a threshold voltage of the thin film transistor can be controlled.

A single layer or a stack of a plurality of layers formed of silicon oxide, silicon nitride, silicon nitride oxide, or the like may be used as a first insulating film 663. In this case, high-density plasma is applied to the surface of the first insulating film 663 in an oxidized atmosphere or a nitrided atmosphere; therefore, the first insulating film 663 may be oxidized or nitrided to be densified. The high-density plasma is, for example, generated by using a high frequency of 2.45 GHz as described above. Note that high-density plasma with an electron density of $10^{11}$ to $10^{13}/cm^3$ or more and an electron temperature of 2 eV or less, and an ion energy of 5 eV or less is used. Plasma can be generated by using a plasma processing apparatus utilizing a radio frequency excitation, which employs a radial slot antenna. The antenna which generates a radio frequency and the substrate 600 are placed at a distance of 20 to 80 mm (preferably, 20 to 60 mm) in the apparatus for generating high-density plasma.

Before forming the first insulating film 663, the surface of the semiconductor layer 662 may be oxidized or nitrided by applying the high-density plasma treatment to the surfaces of the semiconductor layer 662 and the semiconductor layer 660. At this time, by performing the treatment in an oxidized atmosphere or a nitrided atmosphere with the substrate 600 at a temperature of 300 to 450° C., a favorable interface can be formed with the first insulating film 663 which is formed thereover.

As the nitrided atmosphere, an atmosphere containing nitrogen (N) and rare gas (containing at least one of He, Ne, Ar, Kr, and Xe), an atmosphere containing nitrogen, hydrogen (H), and rare gas, or an atmosphere containing ammonium ($NH_3$) and rare gas can be used. As the oxidized atmosphere, an atmosphere containing oxygen (O) and rare gas, an atmosphere containing oxygen, hydrogen (H), and rare gas or an atmosphere containing dinitrogen monoxide ($N_2O$) and rare gas can be used.

As the gate electrode 664, one element of Ta, W, Ti, Mo, Al, Cu, Cr, and Nd, or an alloy or a compound containing a plurality of the above elements can be used. Alternatively, a single layer structure or a stacked structure formed of these elements, an alloy, or a compound thereof can be employed. In the figures, the gate electrode 664 has a two-layer structure. Note that the gate electrode 664 and a wiring which is formed simultaneously with the gate electrode 664 are preferably led so that corner portions thereof are rounded when seen in a direction 3005 perpendicular to the top surface of the substrate 600. The gate electrode 664 and the wiring can be led similarly to the method shown in FIG. 12B. The mask layout as shown in Embodiment Mode 4 may be used to have the rounded corner portions. The gate electrode 664 and the wiring which is formed simultaneously with the gate electrode 664 are shown as wirings 3012 in the figures. By rounding corner portions 1502b of the wiring 3012 of the present invention as compared to corner portions 1501b of the conventional wiring 3012, dusts or the like can be prevented from remaining at the corner portions of the wire. In this manner, defects of a semiconductor device caused by dusts can be reduced and the yield can be improved.

A thin film transistor is formed of the semiconductor layer 662, the gate electrode 664, and the first insulating film 663 which serves as a gate insulating film between the semiconductor layer 662 and the gate electrode 664. In this embodiment mode, the thin film transistor has a top gate structure; however, it may be a bottom gate transistor having a gate electrode under the semiconductor layer, or a dual gate transistor having gate electrodes over and under the semiconductor layer.

It is desirable that a second insulating layer 667 is an insulating film such as a silicon nitride film having a barrier property to block ion impurities. The second insulating film 667 is formed of silicon nitride or silicon oxynitride. The second insulating film 667 functions as a protective film which prevents contamination of the semiconductor layer 662. By introducing hydrogen gas and applying the above high-density plasma treatment after depositing the second insulating film 667, the second insulating layer 667 may be hydrogenated. Alternatively, the second insulating layer 667 may be nitrided and hydrogenated by introducing ammonium gas ($NH_3$). Otherwise, oxidization-nitriding treatment and hydrogenation treatment may be performed by introducing oxygen, dinitrogen monoxide ($N_2O$) gas, or the like together with hydrogen gas. By performing nitriding treatment, oxidization treatment, or oxidization-nitriding treatment by this method, the surface of the second insulating layer 667 can be densified. In this manner, a function of the second insulating layer 667 as a protective film can be enhanced. Hydrogen introduced in the second insulating film 667 is discharged when thermal treatment at 400 to 450° C. is applied, thereby the semiconductor layer 662 can be hydrogenated. Note that the hydrogenation may be performed in combination with hydrogenation using the first insulating film 663.

A third insulating layer 665 can be formed of a single layer structure or a stacked structure of an inorganic insulating film or an organic insulating film. As an inorganic insulating film, a silicon oxide film formed by a CVD method, a silicon oxide film formed by a SOG (Spin On Glass) method, or the like can be used. As an organic insulating film, a film formed of polyimide, polyamide, BCB (benzocyclobutene), acrylic, a positive photosensitive organic resin, a negative photosensitive organic resin, or the like can be used.

The third insulating film 665 may be formed of a material having a skeleton structure formed of a bond of silicon (Si) and oxygen (O). An organic group containing at least hydrogen (such as an alkyl group or aromatic hydrocarbon) is used as a substituent of this material. Alternatively, a fluoro group may be used as the substituent. Further alternatively, a fluoro group and an organic group containing at least hydrogen may be used as the substituent.

As a wiring 666, one element of Al, Ni, W, Mo, Ti, Pt, Cu, Ta, Au, and Mn or an alloy containing a plurality of the elements can be used. Alternatively, a single layer structure or a stacked structure formed of these elements or an alloy thereof can be employed. In the figures, the wiring 666 has a single-layer structure. Note that the wiring 666 is preferably led so that corner portions thereof are rounded when seen in a direction 3005 perpendicular to the top surface of the substrate 600. The wiring 666 can be led similarly to the method shown in FIG. 12B. The mask layout as shown in Embodiment Mode 4 may be used to have the rounded corner portions. The wiring 666 is shown as wirings 3013 in the figures. By rounding corner portions 1502c of the wiring 3013 of the present invention as compared to corner portions 1501c of the conventional wiring 3013, dusts or the like can be prevented from remaining at the corner portions of the wiring. In this manner, defects of a semiconductor device caused by dusts can be reduced and the yield can be improved. In the structures shown in FIGS. 7A and 7C, the wiring 666 functions as a wiring connected to a source and a drain of a thin film transistor and also functions as the antenna 202. In the structures shown in FIGS. 7B and 7D, the wiring 666 functions as a wiring connected to a source and a drain of the thin film transistor and also functions as the terminal portion 602. In FIGS. 12A and 12B, a contact hole 3014 to connect the wiring 666 and the source and drain of the thin film transistor is shown.

Note that the antenna 202 can be formed by a droplet discharging method using a conductive paste containing nano-particles such as Au, Ag, and Cu. The droplet discharging method is a collective term for a method for forming a pattern by discharging droplets, such as an ink jet method or a dispenser method, which has advantages in that utilization efficiency of a material is improved, and the like.

In the structures shown in FIGS. 7A and 7C, a fourth insulating layer 668 is formed over the wiring 666. As the fourth insulating film 668, a single layer structure or a stacked structure of an inorganic insulating film or an organic insulating film can be used. The fourth insulating film 668 serves as a protective layer of the antenna 202.

Figure 10A:
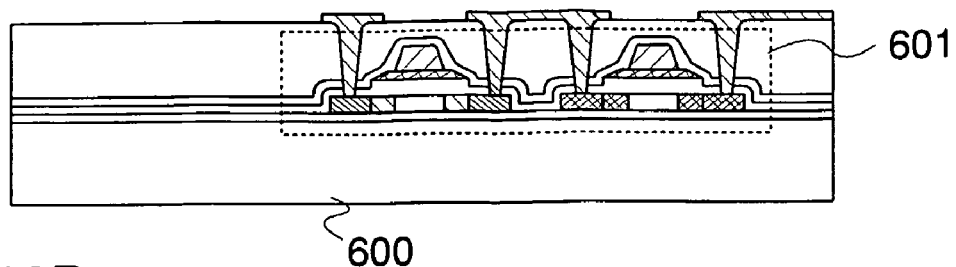
FIGS. 10A to 10D are views each explaining Embodiment Mode 5 according to the present invention.
Figure 10B:
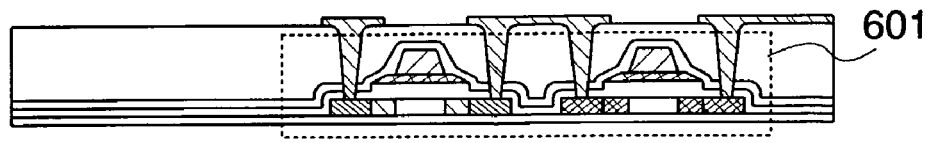
Figure 10C:
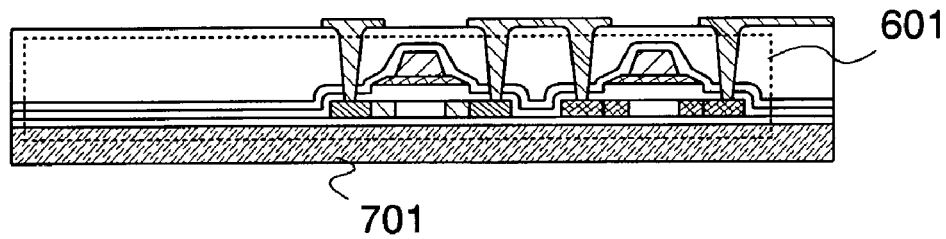
Figure 10D:
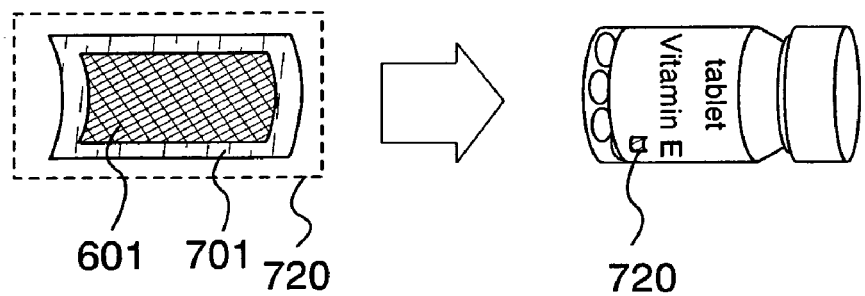

The element group 601 formed over the substrate 600 (see FIG. 10A) may be used as it is; however, the element group 601 may be peeled off the substrate 600 (see FIG. 10B) and attached to a flexible substrate 701 (see FIG. 10C). The flexible substrate 701 has flexibility, for which a plastic substrate, formed of polycarbonate, polyarylate, polyether sulfone, or the like, a ceramic substrate, or the like can be used.

The element group 601 may be peeled off the substrate 600 by (A) providing a peeling layer between the substrate 600 and the element group 601 in advance and removing the peeling layer by using an etchant, (B) partially removing the peeling layer by using an etchant and physically peeling the element group 601 from the substrate 600, or (C) mechanically removing the substrate 600 having high heat resistance over which the element group 601 is formed or removing it by etching with solution or gas. Note that being physically peeled off corresponds to being peeled off by external stress, for example, stress applied by wind pressure blown from a nozzle, ultrasonic wave, and the like.

The above methods (A) and (B) are specifically realized by providing a metal oxide film between the substrate 600 having high heat resistance and the element group 601 and weakening the metal oxide film by crystallization to peel off the element group 601, or by providing an amorphous silicon film containing hydrogen between the substrate 600 having high heat resistance and the element group 601 and removing the amorphous silicon film by laser light irradiation or etching to peel off the element group 601.

The element group 601 which has been peeled off may be attached to the flexible substrate 701 by using a commercialized adhesive, for example, an epoxy resin-based adhesive or a resin additive.

When the element group 601 is attached to the flexible substrate 701 over which an antenna is formed so that the element group 601 and the antenna are electrically connected, a semiconductor device which is thin, lightweight, and can withstand shock when dropped is completed (see FIG. 10C). When the flexible substrate 701 is used, an inexpensive semiconductor device can be provided. Moreover, since the flexible substrate 701 has flexibility, it can be attached to a curved surface or an irregular surface and a variety of applications can be realized. For example, a wireless tag 720 as one mode of the semiconductor device of the present invention can be tightly attached to, for example, a surface such as one of a medicine bottle (see FIG. 10D). Moreover, by reusing the substrate 600, a semiconductor device can be manufactured at low cost.

This embodiment mode can be implemented by arbitrarily combined with Embodiment Modes 1 to 4.

Embodiment Mode 6

Figure 11A:
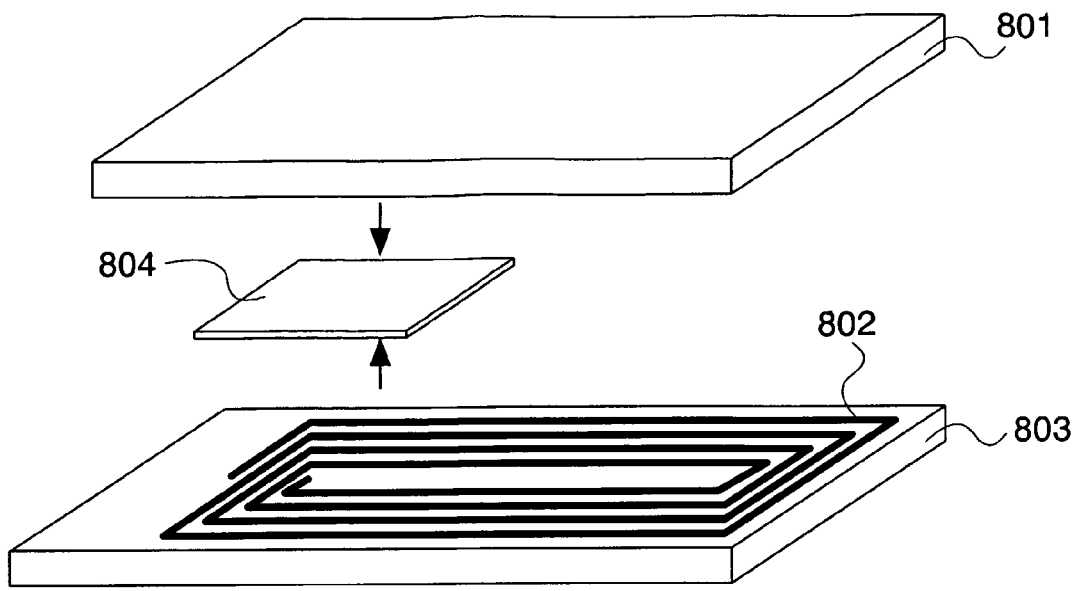
FIGS. 11A to 11C are views each explaining Embodiment Mode 6 according to the present invention.

In this embodiment mode, a semiconductor device according to the present invention having a flexible structure will be explained with reference to FIGS. 11A to 11C. In FIG. 11A, a semiconductor device includes a flexible protective layer 801, a flexible protective layer 803 including an antenna 802, and an element group 804 formed by a peeling process and thinning of a substrate. The element group 804 can have, for example, a similar structure to that of the element group 601 described in Embodiment Mode 5. The antenna 802 formed over the protective layer 803 is electrically connected to the element group 804. In FIG. 11, the antenna 802 is formed only over the protective layer 803; however, the present invention is not limited to this structure and the antenna 802 may be formed over the protective layer 801 as well. Note that a barrier film formed of a silicon nitride film or the like may be formed between the element group 804 and the protective layer 801 and the protective layer 803. As a result, a semiconductor device with improved reliability can be provided without contaminating the element group 804.

The antenna 802 can be formed of Ag, Cu, or a metal plated with Ag or Cu. The element group 804 and the antenna 802 can be connected to each other by using an anisotropic conductive film and applying ultraviolet treatment or ultrasonic wave treatment. Note that the element group 804 and the antenna 802 may be attached to each other by using a conductive paste.

By sandwiching the element group 804 by the protective layer 801 and the protective layer 803, a semiconductor device is completed (see an arrow in FIG. 11A).

Figure 11B:
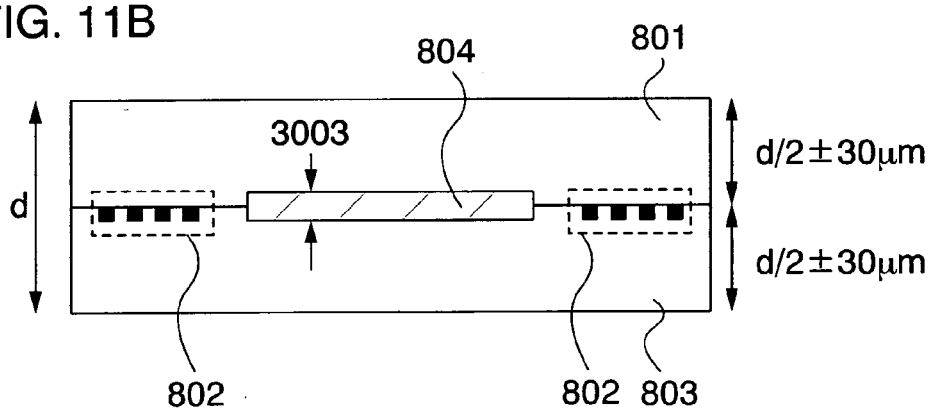
Figure 11C:
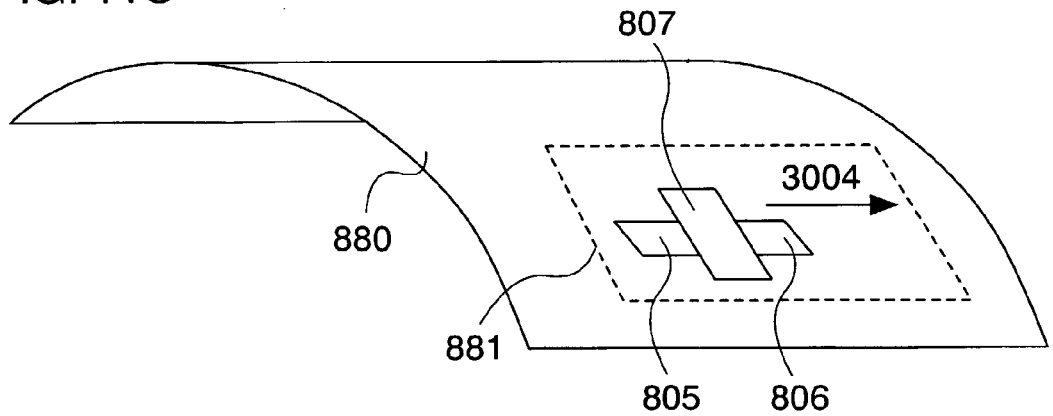

FIG. 11B shows a cross-sectional structure of the semiconductor device formed in this manner. The element group 804 which is sandwiched has a thickness 3003 of 5 µm or less, or preferably 0.1 to 3 µm. In addition, when the protective layer 801 and the protective layer 803 which are overlapped have a thickness of d, each of the protective layer 801 and the protective layer 803 preferably has a thickness of (d/2)±30 µm, and much preferably (d/2)±10 µm. Further, it is desirable that each of the protective layer 801 and the protective layer 803 have a thickness of 10 to 200 µm. Furthermore, the element group 804 has an area of 10 mm square (100 mm$^2$) or less and much preferably 0.3 to 4 mm square (0.09 to 16 mm$^2$).

The protective layer 801 and the protective layer 803 which are formed of an organic resin material have high resistance against bending. The element group 804 which is formed by a peeling process and thinning of a substrate also has higher resistance against bending as compared to a single crystal semiconductor. Since the element group 804, the protective layer 801, and the protective layer 803 can be tightly attached to each other without any space, a completed semiconductor device has high resistance against bending. The element group 804 surrounded by the protective layer 801 and the protective layer 803 may be provided over a surface of or inside another object or embedded in paper.

Explanation will be given with reference to FIG. 11C of a case of attaching a semiconductor device including the element group 804 to a substrate having a curved surface. In the figure, one transistor 881 selected from the element group 804 is shown. In the transistor 881, a current flows from one 805 of a source and a drain to the other 806 of the source and the drain in accordance with a potential of a gate electrode 807. The transistor 881 is provided so that the direction of current flow in the transistor 881 (a carrier movement direction 3004)

and the direction of the arc of the substrate 880 cross at right angles. With such an arrangement, the transistor 881 is less affected by stress even when the substrate 880 is bent and draws an arc, and thus variations in characteristics of the transistor 881 included in the element group 804 can be suppressed.

This embodiment mode can be implemented by arbitrarily combined with Embodiment Modes 1 to 5.

Embodiment Mode 7

Figure 13:
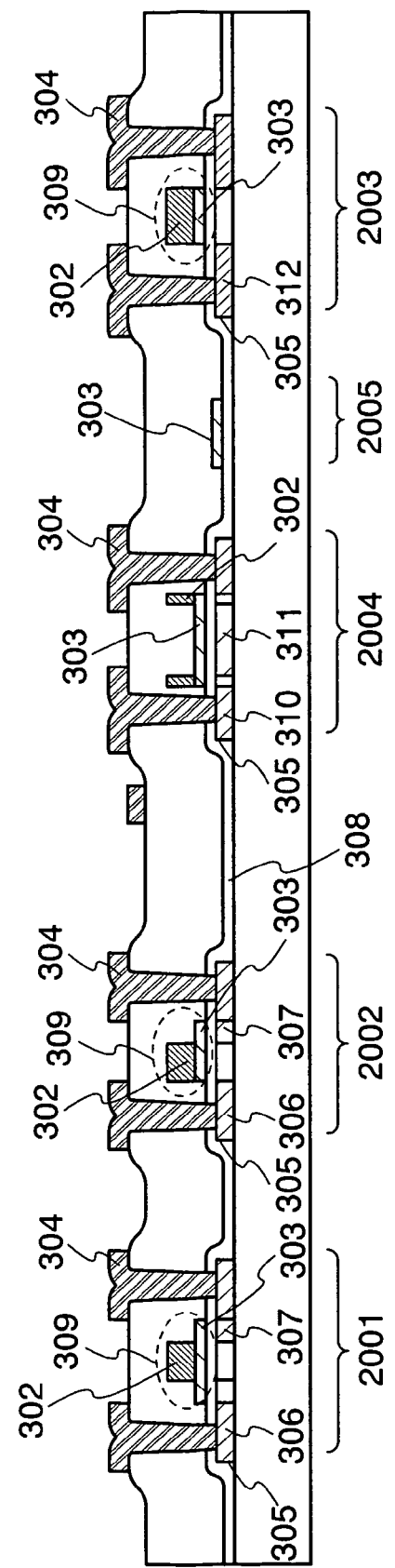
FIG. 13 is a view explaining Embodiment Mode 7 according to the present invention.

In this embodiment mode, a configuration example of a transistor included in a circuit of a semiconductor device 201 will be shown. The transistor can be formed of a MOS transistor formed on a single crystalline substrate, as well as a thin film transistor (TFT). FIG. 13 is a view showing a cross-sectional structure of a transistor including these circuits. FIG. 13 shows N-channel transistors 2001 and 2002, a capacitor element 2004, a resistive element 2005, and a P-channel transistor 2003. Each transistor is provided with a semiconductor layer 305, an insulating layer 308, and a gate electrode 309. The gate electrode 309 is formed in a stacked structure of a first conductive layer 303 and a second conductive layer 302. In addition, FIGS. 14A to 14E are top views corresponding to the transistor, capacitor element, and resistive element shown in FIG. 13, which can be also referred to.

In FIG. 13, in the semiconductor layer 305 of the N-channel transistor 2001, a pair of impurity regions 307 is formed to sandwich and to be in contact in a channel length direction (a direction that a carrier flows) with a region overlapped with the gate electrode 309. Accordingly, the pair of impurity regions 307 is formed on both sides of the gate electrode 309. Impurity regions 306 are source and drain regions, which are in contact with a wiring 304. The impurity regions 307 are low-concentration drain (LDD) regions where an impurity element is doped in a lower concentration than the impurity concentration of the impurity regions 306. In the N-channel transistor 2001, phosphorus or the like is added to the impurity regions 306 and the impurity regions 307 as an impurity imparting N-type conductivity.

Figure 14A:
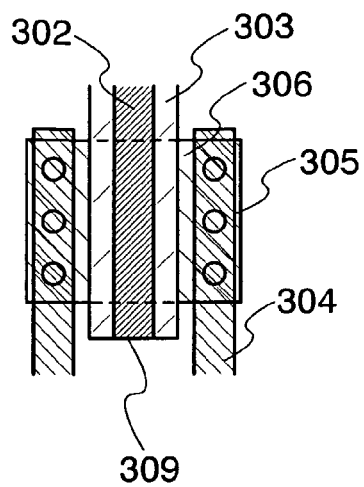
FIGS. 14A to 14E are views each explaining Embodiment Mode 7 according to the present invention.

As shown in FIG. 14A, the first conductive layer 303 of the gate electrode 309 in the N-channel transistor 2001 is formed so as to spread on both sides of the second conductive layer 302. In this case, the first conductive layer 303 is formed so that a film thickness thereof is thinner that that of the second conductive layer 302. The first conductive layer 303 is formed to have a film thickness that can pass through ion species that are accelerated at an electric field of 10 to 100 kV. The impurity regions 307 are formed to overlap with the first conductive layer 303 of the gate electrode 309. In other words, an LDD region that overlaps with the gate electrode 309 is formed. In this structure, the impurity regions 307 are formed in a self-aligned manner by adding an impurity of one conductivity type through the first conductive layer 303 in the gate electrode 309 by using a second conductive layer 302 as a mask. In other words, the LDD region overlapped with the gate electrode 309 is formed in a self-aligned manner.

A transistor having LDD regions on the both sides of a gate electrode is applied to a rectifier transistor used for the rectifier circuit 212 in the power supply circuit 204 in FIG. 1 or a transistor included in a transmission gate (also referred to as an analog switch) used for a logical circuit. These transistors have source and drain electrodes where both positive and negative voltages are applied; therefore, it is preferable to provide LDD regions on the both sides of a gate electrode.

Figure 14B:
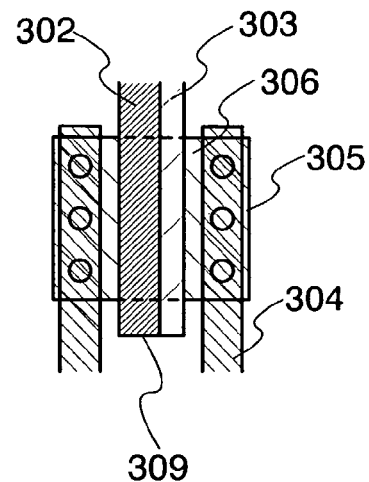

In FIG. 13, an impurity region 307 is formed on one side of the gate electrode 309 in the semiconductor layer 305 of the N-channel transistor 2002. The impurity region 307 is a low-concentration drain (LDD) region where an impurity element is doped in a lower concentration than the impurity concentration of the impurity regions 306. As shown in FIG. 14B, the first conductive layer 303 of the gate electrode 309 in the N-channel transistor 2002 is formed so as to spread on one side of the second conductive layer 302. In this case also, the LDD region can be formed in a self-aligned manner by adding an impurity of one conductivity type through the first conductive layer 303 by using the second conductive layer 302 as a mask.

A transistor having an LDD region on one side of a gate electrode may be applied to a transistor where only a positive voltage or a negative voltage is applied between source and drain electrodes. Specifically, the transistor may be applied to a transistor included in a logic gate such as an inverter circuit, a NAND circuit, a NOR circuit, or a latch circuit, or a transistor included in an analog circuit such as a sense amplifier, a constant voltage generating circuit, or a VCO (Voltage Controlled Oscillator).

Figure 14C:
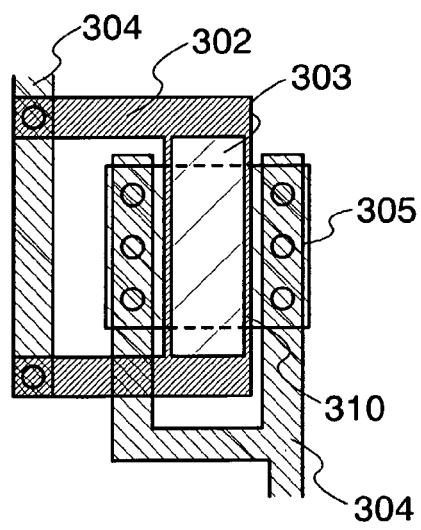

In FIG. 13, the capacitor element 2004 is formed by sandwiching the insulating layer 308 between the first conductive layer 303 and the semiconductor layer 305. The semiconductor layer 305 that forms the capacitor element 2004 is provided with impurity regions 310 and 311. The impurity region 311 is formed in a position of the semiconductor layer 305 overlapped with the first conductive layer 303. In addition, the impurity region 310 is in contact with a wiring 304. An impurity of one conductivity type can be added to the impurity region 311 through the first conductive layer 303; therefore, the impurity concentrations contained in the impurity regions 310 and 311 can be the same or can be differed. In either case, the semiconductor layer 305 is made to serve as an electrode in the capacitor element 2004; therefore, it is preferable to add an impurity of one conductivity type to reduce the resistance. In addition, as shown in FIG. 14C, the first and second conductive layers 303 and 302 can be made to serve enough as an electrode of the capacitor element 2004 by using the second conductive layer 302 as an auxiliary electrode. Accordingly, it is possible to form the capacitor element 2004 in a self-aligned manner by employing a multiple electrode structure where the first conductive layer 303 is combined with the second conductive layer 302.

The capacitor element 2004 can be used as the storage capacitor 213 of the power supply circuit 204 or a resonance capacitor of the high frequency circuit 203. In particular, since both positive and negative voltages are applied between the two terminals of the capacitor element 2004, the resonance capacitor needs to serve as a capacitor that does not depend on the positive and negative voltages between the two terminals.

Figure 14D:
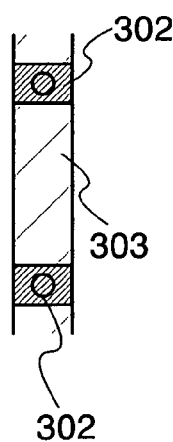
Figure 14E:
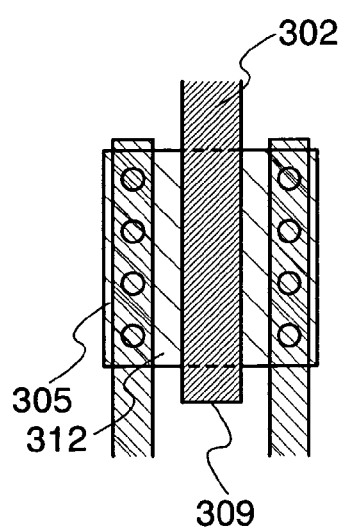

In FIG. 13, the resistive element 2005 is formed of the first conductive layer 303 (see also FIG. 14D). The first conductive layer 303 is formed in a film thickness of approximately 30 to 150 nm; therefore, a width or a length thereof is appropriately set so that the resistive element 2005 can be formed.

The resistive element 2005 can be used as a resistance load of the data modulation circuit 208. In addition, it is possible to use also as a load in a case of controlling current by VCO or the like. The resistive element 2005 may be formed of a semiconductor layer containing an impurity element imparting a conductivity type in a high concentration or a metal layer having a thin film thickness. The resistance of the semiconductor layer depends on a film thickness, film quality, an impurity concentration, an activation ratio, whereas the resistance of the metal layer depends on a film thickness and film quality, which preferably has few fluctuations.

In FIG. 13, in the P-channel transistor 2003, the semiconductor layer 305 is provided with impurity regions 312. The impurity regions 312 serve as source and drain regions to be in contact with a wiring 304. A structure of the gate electrode 309 is a structure where the first and second conductive layers 303 and 302 are superposed (see also FIG. 14E). The P-channel transistor 2003 is a transistor having a single drain structure without an LDD region. In a case of forming the P-channel transistor 2003, boron or the like is added to the impurity regions 312 as an impurity imparting P-type conductivity. On the other hand, an N-channel transistor having a single drain structure can also be formed by adding phosphorus or the like to the impurity region 312 as an impurity imparting N-type conductivity.

One or both of the semiconductor layer 305 and the gate insulating layer 308 may be oxidized or nitrided by high-density plasma treatment. The treatment can be performed in the same manner as the method shown in Embodiment Mode 5.

According to the above treatment, a defect level of an interface between the semiconductor layer 305 and the gate insulating layer 308 can be reduced. The gate insulating layer 308 can be formed in a dense film by performing the treatment to the gate insulating layer 308. In other words, it is possible to suppress generation of charge defect and to suppress fluctuation of a threshold voltage of the transistor. In addition, when the transistor is driven at a voltage of 3V or less, an insulating layer that is oxidized or nitrided by the plasma treatment can be applied as the gate insulating layer 308. Moreover, when a drive voltage of the transistor is 3V or more, the gate insulating layer 308 can be formed by combining an insulating layer formed over a surface of the semiconductor layer 305 by the plasma treatment and an insulating layer deposited by a CVD method (a plasma CVD method or a thermal CVD method). Further, in the same manner, this insulating layer can also be used as a dielectric layer of the capacitor element 2004. In this case, the insulating layer that is formed by the plasma treatment can be formed to be 1 to 10 nm thick, which is a dense film; therefore, it is possible to form a capacitor element having a high charge capacity.

Elements of various structures can be formed by combining conductive layers different in film thickness as the explanation is given with reference to FIG. 13 and FIGS. 14A to 14E. A region where only the first conductive layer is formed and a region where the first and second conductive layers are stacked can be formed by using a photomask or a reticle provided with a diffraction grating pattern or an assist pattern, having a function of reducing light intensity, composed of a semi-transparent film. In other words, in exposing a photoresist to light in a photolithography step, a thickness of resist masks to be developed are made different by adjusting the amount of light-transmitting light of the photomask. In this case, the photomask or reticle provided with slits of the resolution limit or less may be used to form the above resist having a complicated shape as described above. In addition, baking at about 200° C. may be performed after development to deform a mask pattern formed from a photoresist material.

In addition, by using the photomask or reticle provided with an assist pattern that is composed of a diffraction grating pattern or a semi-transparent film and has a function of reducing light intensity, the region where only the first conductive layer is formed and the region where the first and second conductive layers are stacked can be formed continuously. As shown in FIG. 14A, the region where only the first conductive layer is formed can be selectively formed over the semiconductor layer. Providing the region where only the first conductive layer is formed over the semiconductor layer is effective in that an LDD region can be manufactured in a self-aligned manner or the like; however, the region where only the first conductive layer is formed is not necessary in a region other than a top face of the semiconductor layer (a wiring region formed continuously with the gate electrode). By using the photomask or reticle, it is not necessary to form the region where only the first conductive layer is formed in a wiring portion; thus, density of a wiring can be substantially increased.

In the case of FIG. 13 and FIGS. 14A to 14E, the first conductive layer is formed from a refractory metal such as tungsten (W), chromium (Cr), tantalum (Ta), tantalum nitride (TaN), or molybdenum (Mo), or an alloy or a compound containing the refractory metal as its main component to be 30 to 50 nm thick. In addition, the second conductive layer is formed from a refractory metal such as tungsten (W), chromium (Cr), tantalum (Ta), tantalum nitride (TaN), or molybdenum (Mo), or an alloy or a compound containing the refractory metal as its main component to be 300 to 600 nm thick. For example, the first and second conductive layers are each formed from a different conductive material to have a different etching rate in an etching step that will be performed subsequently. As an example, a TaN film can be used as the first conductive layer and a tungsten film can be used as the second conductive layer.

This embodiment mode shows a method for separately manufacturing a transistor, a capacitor element, and a resistive element each having a different electrode structure in an etching step using the same photomask or reticle by using the photomask or reticle provided with an assist pattern that is composed of a diffraction grating pattern or a semi-transparent film and has a function of reducing light intensity. Accordingly, elements having different modes can be manufactured and integrated without increasing the steps depending on characteristics of the circuits.

This embodiment mode can be implemented by arbitrarily combined with Embodiment Modes 1 to 6.

Embodiment Mode 8

In this embodiment mode, an example of a static RAM (SRAM) that can be used as the memory circuit 210 and the like of the semiconductor device 201 will be explained with reference to FIGS. 15A and 15B, FIGS. 16A and 16B, and FIGS. 17A and 17B.

Figure 15A:
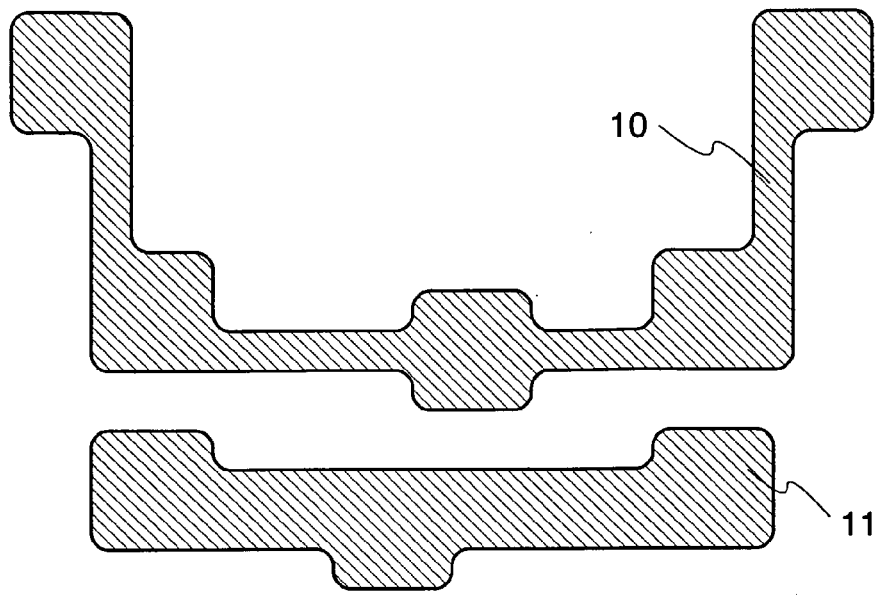
FIGS. 15A and 15B are views each explaining Embodiment Mode 8 according to the present invention.

It is preferable to form semiconductor layers 10 and 11 shown in FIG. 15A with silicon or a crystalline semiconductor containing silicon as its component. For example, as the semiconductor layers 10 and 11, polycrystalline silicon, single crystal silicon, or the like that is a silicon film crystallized by laser annealing or the like is applied. Besides, it is also possible to apply a metal-oxide semiconductor, amorphous silicon, or an organic semiconductor that shows semiconductor characteristics.

In either case, the semiconductor layer to be formed first is formed over an entire surface or part (a region having an area larger than a region determined as a semiconductor region of a transistor) of a substrate having an insulating surface. Then, a mask pattern is formed over the semiconductor layer by a photolithography technique. Island-shaped semiconductor layers 10 and 11 in a specific shape including source and drain regions and a channel formation region of a transistor are formed by performing etching treatment of the semiconductor layers with the use of the mask pattern.

Figure 15B:
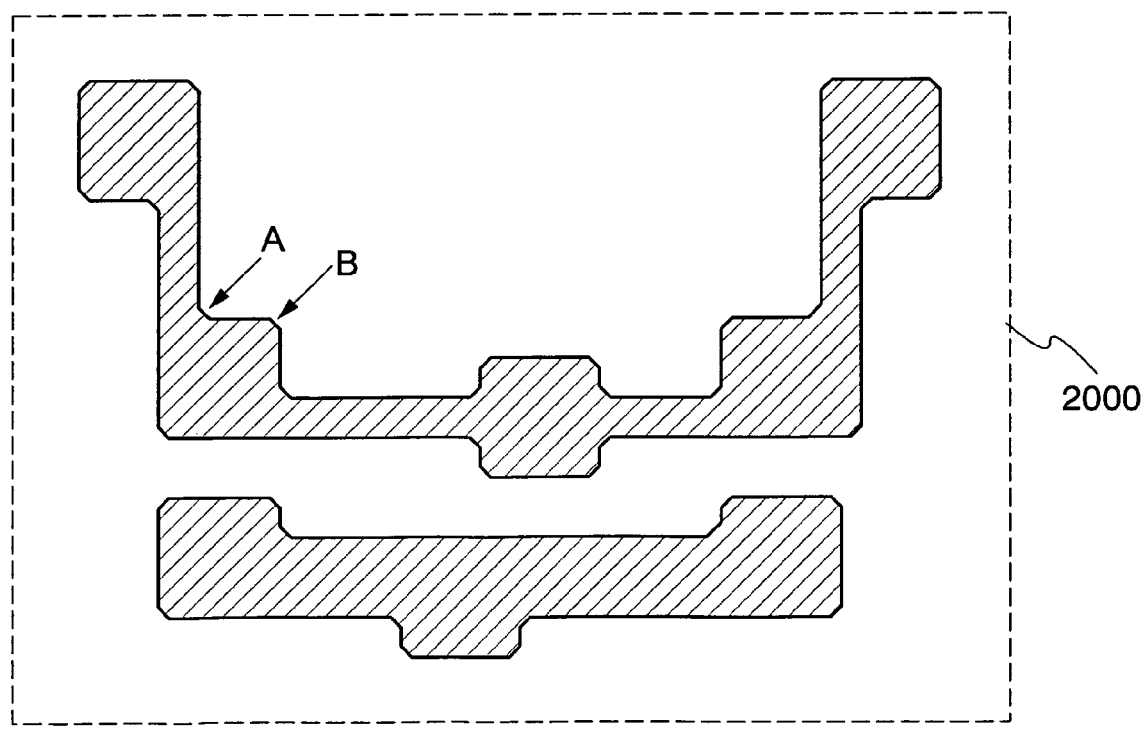

A photomask for forming the semiconductor layers 10 and 11 shown in FIG. 15A is provided with a mask pattern 2000 shown in FIG. 15B. The mask pattern 2000 differs depending on whether a resist used for a photolithography step is a positive type or a negative type. In the case where the positive resist is used, the mask pattern 2000 shown in FIG. 15B is manufactured as a light shielding portion. The mask pattern 2000 has a shape identical to a polygon the top portion A of which is removed. The photomask pattern is chamfered so as to cut off a rectangular triangle one side of which is 10 μm or less at a corner, for example. In addition, a bent portion B has a shape that the corner is bended so as not to be orthogonal. When the bent portion B is enlarged, there is a shape bended over a plurality of levels (see the structures shown with reference to FIG. 6 in Embodiment Mode 5).

The shape of the mask pattern 2000 shown in FIG. 15B is reflected in the semiconductor layers 10 and 11 shown in FIG. 15A. In this case, a shape similar to the mask pattern 2000 may be transferred or may be transferred so that the corner of the mask pattern 2000 is further rounded. In other words, a rounded portion where a pattern shape is smoothed much more than the mask pattern 2000 may also be provided.

Figure 16A:
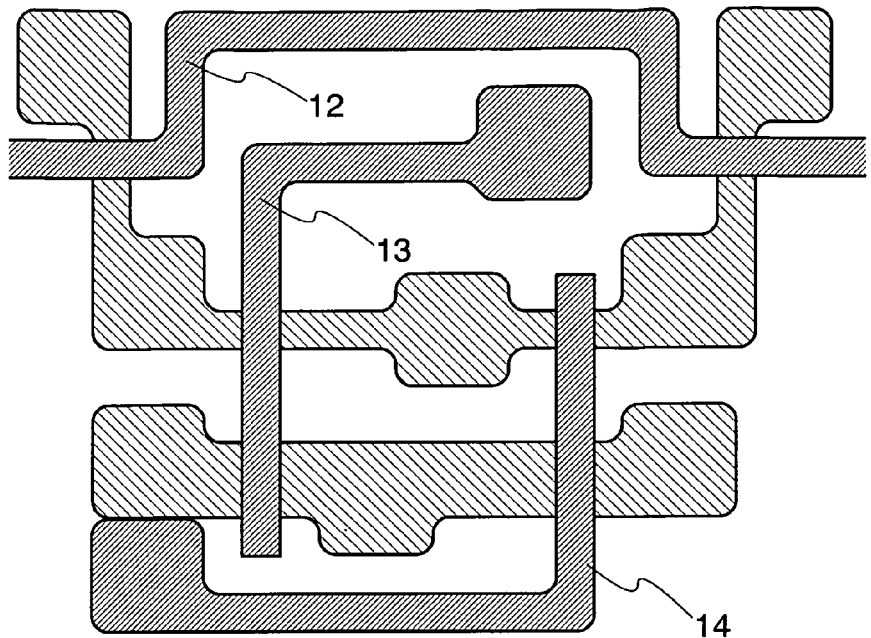
FIGS. 16A and 16B are views each explaining Embodiment Mode 8 according to the present invention.

An insulating layer partially containing at least silicon oxide or silicon nitride is formed over the semiconductor layers 10 and 11. One of the objects to form the insulating layer is a gate insulating layer. Then, as shown in FIG. 16A, gate wirings 12, 13, and 14 are formed so that part thereof overlaps with the semiconductor layers. The gate wiring 12 is formed corresponding to the semiconductor layer 10. The gate wiring 13 is formed corresponding to the semiconductor layers 10 and 11. In addition, the gate wiring 14 is formed corresponding to the semiconductor layers 10 and 11. By forming a metal layer or a semiconductor layer having high conductivity, the shape of the gate wirings is formed over the insulating layer by a photolithography technique.

Figure 16B:
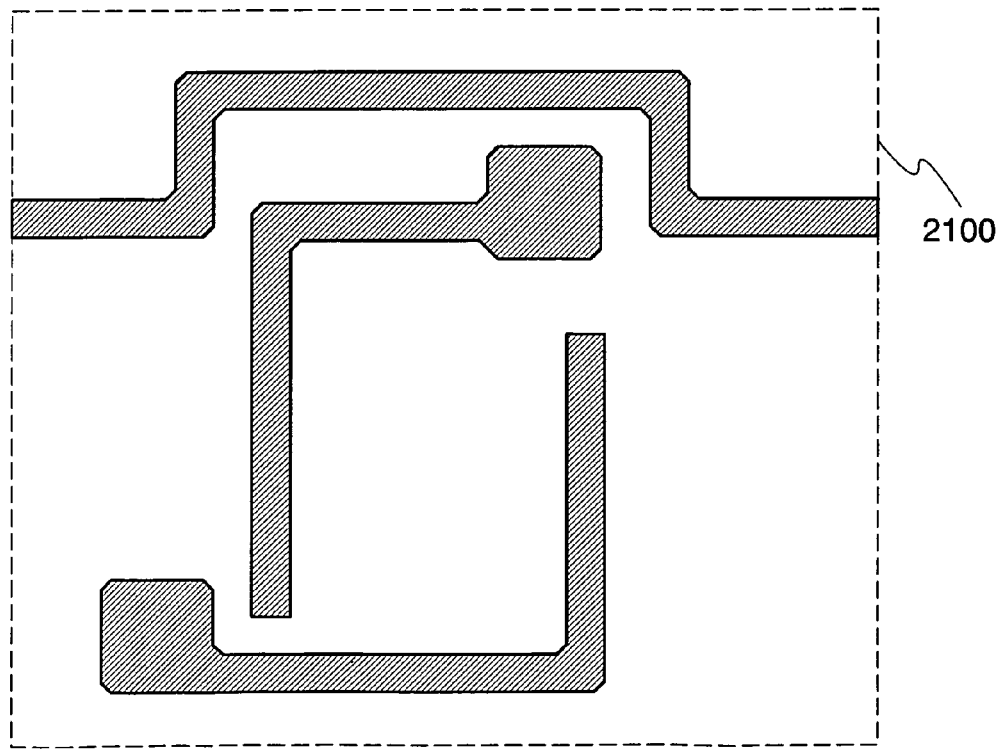

A photomask for forming these gate wirings is provided with a mask pattern 2100 shown in FIG. 16B. The mask pattern 2100 has a pattern where a corner that is a right triangle in each edge bent into an L shape is removed so that one side of the triangle is 10 μm or less, or equal to or longer than one-fifth the width of the mask pattern 2100 and equal to or shorter than half the width of the mask pattern 2100; therefore, the edge is rounded. In other words, the circumference of the mask pattern 2100 in the edge is curved when seen from above. Specifically, in order to form a round circumference of the edge, part of the mask pattern 2100 is removed, which corresponds to an isosceles right triangle having two first straight lines that are perpendicular to each other making the edge, and a second straight line that makes an angle of about 45 degrees with the two first straight lines. When removing the triangle, two obtuse angles are formed in the mask pattern 2100. At this time, the mask pattern 2100 is preferably etched by appropriately adjusting the etching conditions and/or a mask design so that a curved line in contact with the first straight line and the second straight line is formed in each obtuse angle portion. Note that the length of the two sides of the isosceles right triangle, which are equal to each other, is equal to or longer than one-fifth the width of the mask pattern 2100 and equal to or shorter than half the width of the mask pattern 2100. In addition, the inner circumference of the edge is also made curved in accordance with the circumference of edge. The shape of the mask pattern 2000 shown in FIG. 16B is reflected in the gate wirings 12, 13, and 14 shown in FIG. 16A. In this case, a shape similar to the mask pattern 2100 may be transferred or may be transferred so that the corner of the mask pattern 2100 is further rounded. In other words, a rounded portion where a pattern shape is smoothed much more than the mask pattern 2100 may also be provided. Specifically, the corners of the gate wirings 12, 13, and 14 may be rounded. Generation of fine particles due to overdischarge can be suppressed in a convex portion when dry etching is performed by plasma, and in a concave portion, fine particles that likely to gather at the corner can be washed away even if the fine particles are generated at the time of cleaning. Consequently, there is an effect that improvement of yield can be fully expected.

An interlayer insulating layer is a layer that is formed next to the gate wirings 12, 13, and 14. The interlayer insulating layer is formed using an inorganic insulating material such as silicon oxide or an organic insulating material using polyimide, acrylic resin, or the like. An insulating layer such as silicon nitride or silicon nitride oxide may be interposed between the interlayer insulating layer and the gate wirings 12, 13, and 14. In addition, an insulating layer such as silicon nitride or silicon nitride oxide may be provided over the interlayer insulating layer. The insulating layer can prevent the semiconductor layers and the gate insulating layer from being contaminated with impurities such as exogenous metal ion or moisture that is not preferable for a thin film transistor (TFT).

Figure 17A:
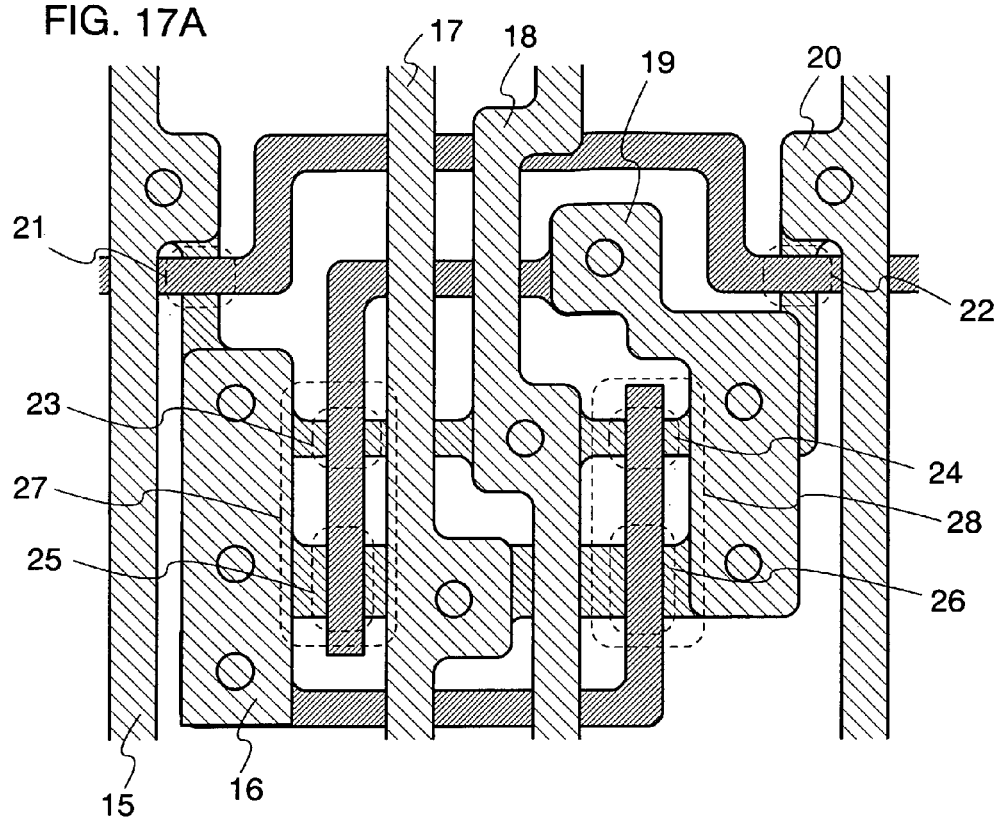
FIGS. 17A and 17B are views each explaining Embodiment Mode 8 according to the present invention.

An opening is formed in a predetermined position of the interlayer insulating layer. For example, the opening is provided corresponding to the gate wiring in the lower layer and the semiconductor layer. In a wiring layer formed of a layer or a plurality of layers of metal or a metal compound, a mask pattern thereof is formed by a photolithography technique and a predetermined pattern is formed by etching processing. Then, as shown in FIG. 17A, wirings 15, 16, 17, 18, 19, and 20 are formed so that parts thereof are overlapped with semiconductor layers 10 and 11. Specific elements are connected therebetween by the wirings. The wirings do not connect the specific elements therebetween in a straight line but a bent portion is included with limitation of the layout. In addition, a width of the wirings is changed in a contact portion with other wirings or other regions. When the size of a contact hole is the same or larger than a width of the wirings, the width of the wirings is changed to expand in the contact portion.

Figure 17B:
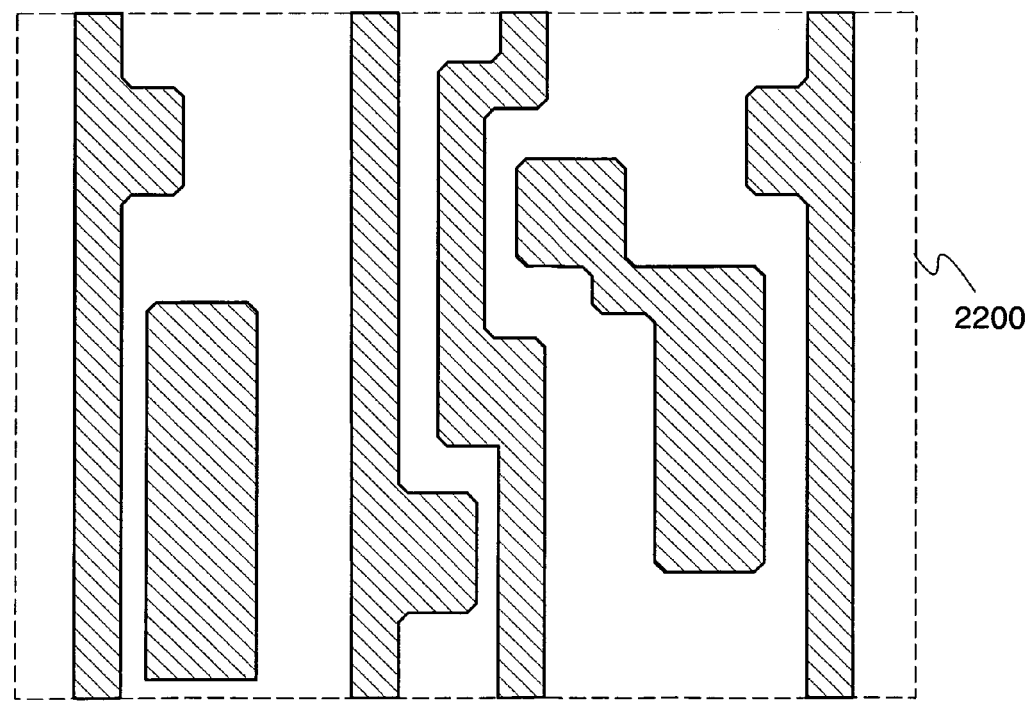

A photomask for forming these wirings 15 to 20 is provided with a mask pattern 2200 shown in FIG. 17B. In this case also, the wirings each have a pattern where a corner that is a right triangle in each edge bent into an L shape is removed so that one side of the triangle is 10 μm or less, or equal to or longer than one-fifth the width of the wiring and equal to or shorter than half the width of the wiring; therefore, the edge is rounded. In other words, the circumference of the wiring in the edge is curved when seen from above. Specifically, in order to form a round circumference of the edge, part of the wiring is removed, which corresponds to an isosceles right triangle having two first straight lines that are perpendicular to each other making the edge, and a second straight line that makes an angle of about 45 degrees with the two first straight lines. When removing the triangle, two obtuse angles are formed in the wiring. At this time, the wiring is preferably etched by appropriately adjusting the etching conditions and/or a mask design so that a curved line in contact with the first straight line and the second straight line is formed in each obtuse angle portion. Note that the length of the two sides of the isosceles right triangle, which are equal to each other, is equal to or longer than one-fifth the width of the wiring and equal to or shorter than half the width of the wiring. In addition, the inner circumference of the edge is also made curved in accordance with the circumference of edge. In such wirings, generation of fine particles due to overdischarge can be suppressed in a convex portion when dry etching is performed by plasma, and in a concave portion, fine particles that likely to gather at the corner can be washed away even if the fine particles are generated at the time of cleaning. Consequently, there is an effect that improvement of yield can be fully expected. It can be expected that electrical conduction of the wirings can be made preferable by having the corners of the wirings rounded. In addition, it is extremely advantageous in washing dust away to use the wirings with the rounded corners in a structure where a number of wirings are provided in parallel.

In FIG. 17A, N-channel transistors 21, 22, 23, and 24, and P-channel transistors 25 and 26 are formed. The N-channel transistor 23 and the P-channel transistor 25 are included in an inverter 27. The N-channel transistor 24 and the P-channel transistor 26 are included in an inverter 28. Circuits including these six transistors form a SRAM. An insulating layer such as silicon nitride or silicon oxide may be formed in the upper layer of these transistors.

This embodiment mode can be implemented by arbitrarily combined with Embodiment Modes 1 to 7.

Embodiment

In this embodiment, applications of the semiconductor device 201 according to the present invention will be explained with reference to FIGS. 8A and 8B and FIGS. 9A to 9E. The semiconductor device 201 can be used by providing for paper money, coins, securities, unregistered bonds, documents (a driver's license or a resident's card; see FIG. 9A), packaging containers (wrapping paper or a bottle; see FIG. 9B), recording media (see FIG. 9C) such as DVD software, a compact disc, and a video tape. In addition, the semiconductor device 201 can be used by providing for means of transportation such as cars, motor cycles and bicycles (see FIG. 9D), personal belongings such as bags and glasses (see FIG. 9E), groceries, clothes, daily commodities, and electronic devices. The electronic devices include liquid crystal display devices, EL display devices, television devices (also simply called televisions or television receivers), cellular phones, and the like.

The semiconductor device 201 can be attached to a surface of an object or embedded in an object to be fixed. For example, the semiconductor device 201 is preferably embedded in paper of a book or in an organic resin of a package formed of an organic resin. By providing the semiconductor device 201 in paper money, coins, securities, unregistered bonds, documents, and the like, forgery thereof can be prevented. In addition, by providing the semiconductor device 201 in packaging containers, recording media, personal belongings, groceries, clothes, daily commodities, electronic devices, and the like, efficiency of the inspection system and the system of a rental shop can be facilitated. Moreover, by providing the semiconductor device 201 in means of transportation, forgery and theft thereof can be prevented. By implanting the semiconductor device 201 in living things such as animals, each living thing can be easily identified. For example, by implanting a wireless tag in living things such as domestic animals, its year of birth, sex, breed, and the like can be easily recognized.

As described above, the semiconductor device 201 according to the present invention can be applied to any object (including living things).

The semiconductor device 201 has various advantages in that it can transmit and receive data wirelessly, it can be processed into various shapes, it has a wide directivity and recognition area depending on the selected frequency, and the like.

Figure 8A:
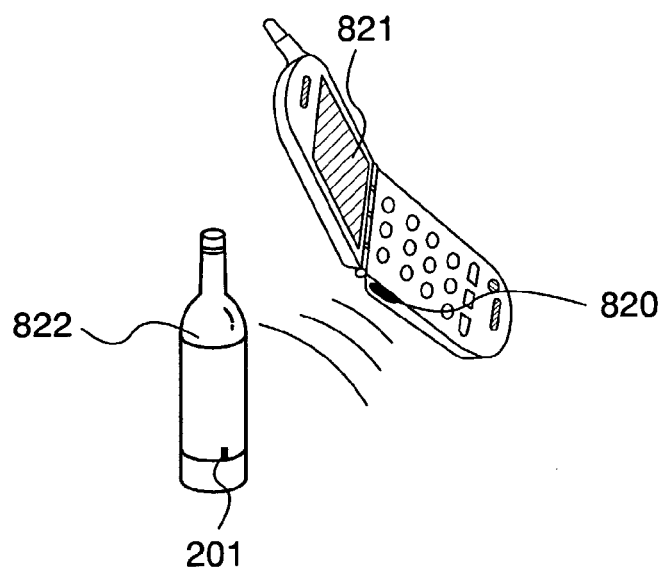
FIGS. 8A and 8B are views each explaining Embodiment according to the present invention.
Figure 8B:
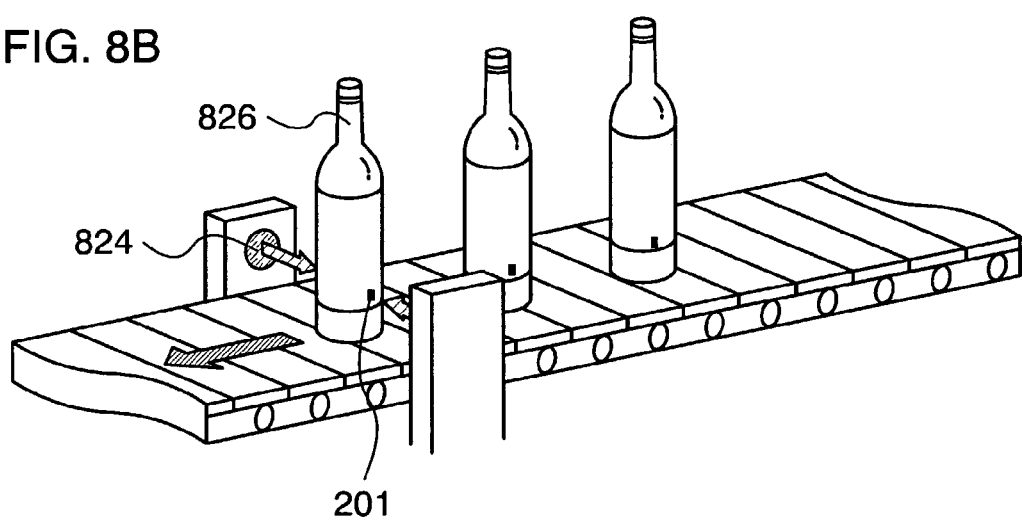
Figure 9A:
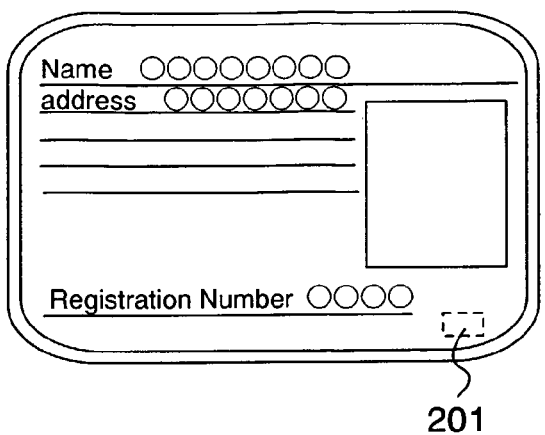
FIGS. 9A to 9E are views each explaining Embodiment according to the present invention.
Figure 9B:
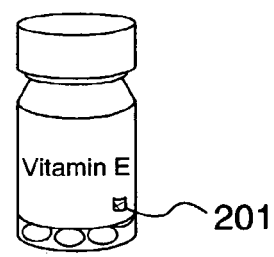
Figure 9C:
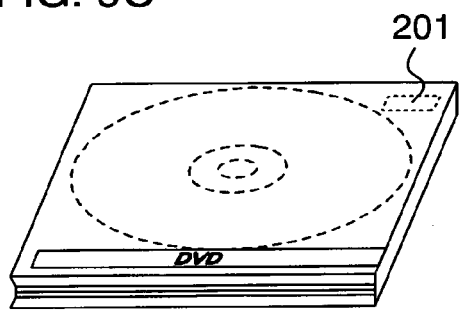
Figure 9D:
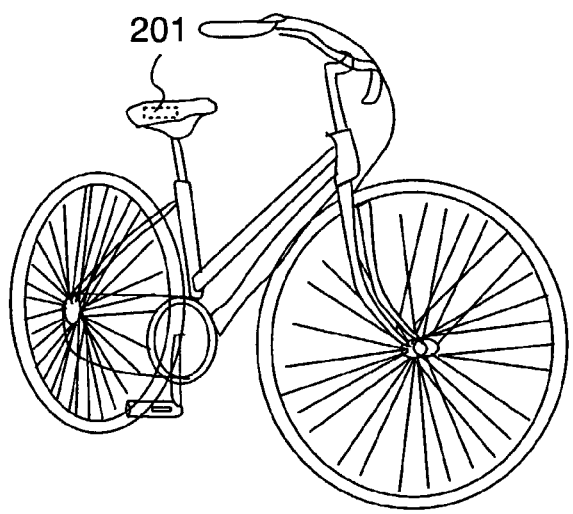
Figure 9E:
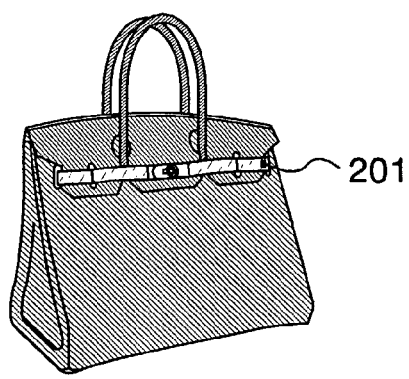

Next, one mode of a system utilizing the semiconductor device 201 will be explained with reference to FIGS. 8A and 8B. A reader/writer 820 is provided on a side surface of a portable terminal including a display portion 821. The semiconductor device 201 is provided on a side surface of an object 822 (see FIG. 8A). When the reader/writer 820 is held near the semiconductor device 201 attached to the object 822, the display portion 821 displays information about the object 822 such as a raw material, a place of origin, a test result of every process, a record of circulation, and description of the object. As another system, in a case of carrying an object 826 by a conveyer belt, the object 826 can be inspected by using the reader/writer 824 and the semiconductor device 201 (see FIG. 8B). In this manner, by applying the semiconductor device 201 according to the present invention to a system, information can be obtained easily and a system with high function and high added value can be provided.

This embodiment mode can be implemented by arbitrarily combined with Embodiment Modes 1 to 8.

The present application is based on Japanese Patent Application serial No. 2005-156469 filed on May 27, 2005 in Japanese Patent Office, the entire contents of which are hereby incorporated by reference.

EXPLANATION OF REFERENCE

10. semiconductor layer, 11. semiconductor layer, 12. gate wiring, 13. gate wiring, 14. gate wiring, 15. wiring, 16. wiring, 17. wiring, 18. wiring, 19. wiring, 20. wiring, 21. transistor, 22. transistor, 23. transistor, 24. transistor, 25. transistor, 26. transistor, 27. inverter, 28. inverter, 101. semiconductor device, 102. antenna, 103. high frequency circuit, 104. power supply circuit, 105. reset circuit, 106. clock generation circuit, 107. data demodulation circuit, 108. data modulation circuit, 109. control circuit, 110. memory circuit, 111. semiconductor integrated circuit, 112. rectifier circuit, 113. storage capacitor, 114. constant voltage circuit, 201. semiconductor device, 202. antenna, 203. high frequency circuit, 204. power supply circuit, 205. reset circuit, 206. clock generation circuit, 207. data demodulation circuit, 208. data modulation circuit, 209. control circuit, 210. memory circuit, 211. semiconductor integrated circuit, 212. rectifier circuit, 213. storage capacitor, 214. constant voltage circuit, 215. level shift circuit, 302. second conductive layer, 303. first conductive layer, 304. wiring, 305. semiconductor layer, 306. impurity region, 307. impurity region, 308. insulating layer, 309. gate electrode, 310. impurity region, 311. impurity region, 312. impurity region, 501. transistor, 502. transistor, 503. transistor, 504. transistor, 505. transistor, 506. transistor, 507. transistor, 508. transistor, 600. substrate, 601. element group, 602. terminal portion, 603. conductive particles, 604. resin, 610. substrate, 661. base film, 662. semiconductor layer, 662a. channel formation region, 662b. impurity region, 662c. low-concentration impurity region 663. first insulating layer, 664. gate electrode, 665. third insulating layer, 666. wiring, 667. second insulating layer, 668. fourth insulating layer, 701. flexible substrate, 720. wireless tag, 801. protective layer, 802. antenna, 803. protective layer, 804. element group, 805. one of source and drain, 806. the other of source and drain, 807. gate electrode, 820. reader/writer, 821. display portion, 822. object, 824. reader/writer, 826. object, 880. substrate, 881. transistor, 901. level shifted demodulated signal, 902. clock, 903. reset signal, 904. analog portion, 905. digital portion, 911. demodulated signal, 912. clock, 913. reset signal, 914. analog portion, 915. digital portion, 921. demodulated signal, 1501a. corner, 1501b. corner, 1501c. corner, 1502a. corner, 1502b. corner, 1502c. corner, 2000. mask pattern, 2100. mask pattern, 2200. mask pattern, 2001. transistor, 2002. transistor, 2003. transistor, 2004. capacitor element, 2005. resistive element, 3003. thickness, 3004. carrier movement direction, 3005. direction, 3011. wiring, 3012. wiring, 3013. wiring, 3014. contact hole, 6001. corner, 6002. corner, 6003. corner, 6004. corner, 6601. semiconductor layer, 6602. semiconductor layer, 6603. first conductive layer, 6604. second conductive layer, and 6605. contact hole.

The invention claimed is:

1. A semiconductor device comprising:
a data demodulation circuit in which a wireless signal is demodulated;
a level shift circuit in which an outputted signal of the data demodulation circuit is inputted; and
a clock generation circuit in which an output of the level shift circuit is inputted;
a control circuit in which the output of the level shift circuit is inputted,
wherein the level shift circuit is supplied with a first DC power supply voltage and a second DC power supply voltage, a voltage amplitude of the second DC power supply voltage is lower than that of the first DC power supply voltage,
wherein the control circuit is supplied with the second DC power supply voltage, and
wherein the level shift circuit outputs a signal having the same voltage amplitude as that of the second DC power supply voltage, which is converted from an inputted signal having the same voltage amplitude as that of the first DC power supply voltage, and
wherein the clock generating circuit outputs a clock signal to the control circuit.

2. A semiconductor device comprising:
an antenna capable of communicating data wirelessly;
a data demodulation circuit in which a wireless signal is demodulated;
a level shift circuit in which an outputted signal of the data demodulation circuit is inputted; and
a clock generation circuit in which an output of the level shift circuit is inputted;
a control circuit in which the output of the level shift circuit is inputted,
wherein the level shift circuit is supplied with a first DC power supply voltage and a second DC power supply voltage, a voltage amplitude of the second DC power supply voltage is lower than that of the first DC power supply voltage,
wherein the control circuit is supplied with the second DC power supply voltage, and
wherein the level shift circuit outputs a signal having the same voltage amplitude as that of the second DC power supply voltage, which is converted from an inputted signal having the same voltage amplitude as that of the first DC power supply voltage, and
wherein the clock generating circuit outputs a clock signal to the control circuit.

3. A semiconductor device comprising:
an antenna capable of communicating data wirelessly;
a data demodulation circuit in which a wireless signal is demodulated;
a power supply circuit for generating a first DC power supply voltage and a second DC power supply voltage, a voltage amplitude of the second DC power supply voltage is lower than that of the first DC power supply voltage from the wireless signal;
a level shift circuit in which an outputted signal of the data demodulation circuit is inputted; and
a clock generation circuit in which an output of the level shift circuit is inputted;
a control circuit in which the output of the level shift circuit is inputted,
wherein the level shift circuit is supplied with the first DC power supply voltage and the second DC power supply voltage,
wherein the control circuit is supplied with the second DC power supply voltage, and
wherein the level shift circuit outputs a signal having the same voltage amplitude as that of the second DC power supply voltage, which is converted from an inputted signal having the same voltage amplitude as that of the first DC power supply voltage, and
wherein the clock generating circuit outputs a clock signal to the control circuit.

4. A semiconductor device according to any one of claims 1 to 3, wherein the control circuit is a circuit for analyzing a signal which is obtained by demodulating the wireless signal.

5. A semiconductor device according to any one of claims 1 to 3, wherein a pulse width of the outputted signal of the data demodulation circuit is the same as that of the outputted signal of the level shift circuit.

6. A semiconductor device comprising:
an antenna;
a data demodulation circuit operationally connected with the antenna and for demodulating a wireless signal from the antenna;
a level shift circuit operationally connected with the data demodulation circuit;
a clock generation circuit in which an output of the level shift circuit is inputted,
a control circuit operationally connected with the level shift circuit; and
a power supply circuit for connecting at least the level shift circuit and the control circuit.

* * * * *